United States Patent
Miyazaki et al.

(10) Patent No.: US 6,489,833 B1
(45) Date of Patent: Dec. 3, 2002

(54) SEMICONDUCTOR INTEGRATED CIRCUIT DEVICE

(75) Inventors: Masayuki Miyazaki, Kokubunji (JP); Koichiro Ishibashi, Warabi (JP); Hiroyuki Mizuno, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/486,057

(22) PCT Filed: Jul. 1, 1998

(86) PCT No.: PCT/JP98/02961
§ 371 (c)(1),
(2), (4) Date: Feb. 22, 2000

(87) PCT Pub. No.: WO99/12263
PCT Pub. Date: Mar. 11, 1999

Related U.S. Application Data

(63) Continuation-in-part of application No. 08/622,389, filed on Mar. 27, 1996.

(30) Foreign Application Priority Data

Mar. 29, 1995 (JP) ............................................. 7-71136
Aug. 28, 1997 (JP) ............................................. 9-232054

(51) Int. Cl.⁷ ................................................ H03K 3/01
(52) U.S. Cl. ..................... 327/534; 327/538; 327/543
(58) Field of Search .............................. 327/534, 535, 327/536, 537, 543, 149, 538, 153, 158, 161, 277; 326/31

(56) References Cited

U.S. PATENT DOCUMENTS 5,264,808 A * 11/1993 Tanaka ........................ 331/57
5,721,510 A * 2/1998 Miyajima .................... 327/536
5,801,570 A * 9/1998 Mizuno et al. .............. 327/362
5,920,226 A * 7/1999 Mimura ....................... 327/537
6,081,146 A * 6/2000 Shiochi et al. ............... 327/277

FOREIGN PATENT DOCUMENTS

| JP | 62-272619 A | * 11/1987 | ................ 327/277 |
| JP | 4247653 | 9/1992 | |
| JP | 5152935 | 6/1993 | |
| JP | 8274620 | 10/1996 | |

OTHER PUBLICATIONS

1994 Symposium on VLSI Technology Digest of Technical Papers, Jun. 1994, pp. 13–14.
Nikkei Electronics 7–28 (1997), pp. 113–126.

* cited by examiner

Primary Examiner—Tuan T. Lam
(74) Attorney, Agent, or Firm—Antonelli, Terry, Stout & Kraus, LLP

(57) ABSTRACT

A semiconductor integrated circuit device includes a logic circuit, a digital-to-analog converter generating a substrate bias for controlling a threshold voltage of an MIS transistor of the logic circuit, a voltage control circuit outputting a control signal in accordance with a delay signal, and a delay detector, including a circuit which monitors variations in operating speed of the delay detector. The delay detector receives the clock signal and outputs the delay signal. The voltage control circuit receives the delay signal and outputs the control signal according to a delay indicated by the delay signal. The digital-to-analog converter receives the control signal from the voltage control circuit and generates a voltage according to the control signal. The operating speed of each of the logic circuits and the delay detector is controlled by a voltage supplied from the digital-to-analog converter.

6 Claims, 38 Drawing Sheets

C : SUPPRESSED VARIATION RANGE BY PROPOSED CONTROL

B : PROPOSED FABRICATION RANGE OF MOS TRANSISTOR

A : VARIATION RANGE OF STANDARD MOS TRANSISTOR

OPAMPP013

OPAMPN013

SEMICONDUCTOR INTEGRATED CIRCUIT DEVICE

This is a continuation-in-part application of patent application Ser. No. 08/622,389 (Mar. 27, 1996) in the United States and contains a part of that disclosure.

TECHNICAL FIELD

The present invention relates to a semiconductor integrated circuit, and, more particularly, a semiconductor integrated circuit device suitable for high-speed operation.

BACKGROUND ART

In an integrated circuit using CMOS transistors, characteristics fluctuation exists due to variations in transistor dimension caused by a fabrication process and a change in the environment, such as temperature or supply voltage, during operation.

As described in "1994 symposium on VLSI technology digest of technical papers" (June, 1994), pp. 13 to 14, as an MOS transistor becomes finer, fluctuation in basic parameters, such as a threshold value due to the characteristics fluctuation caused by a fabrication process, becomes larger.

FIG. 12 schematically shows delay of a CMOS circuit with respect to the device feature size of a MOS transistor and the range of variation. In designing a CMOS integrated circuit, the worst delay in FIG. 12 has to be considered. By an increase in the range of variation, even if the device becomes finer, high-speed operation is limited by the worst delay. If the delay of the CMOS circuit can be made "typical" or "best" by suppressing the characteristics fluctuation, the high processing speed of the circuit can be promoted.

As a method of suppressing the characteristics fluctuation by improving the circuit, in Nikkei Electronics 7–28 (1997), pp. 113 to 126, a technique is described as follows: A leakage current of a monitor is measured and a substrate bias is changed so that the current becomes a constant value. Delay of a replica is also measured. A change in delay is detected, and the supply voltage is changed, thereby suppressing the characteristics fluctuation.

According to the technique described in Nikkei Electronics 7–28 (1997), pp. 113 to 126, the substrate bias is controlled so that the leakage current of the MOS transistor when the gate voltage is 0V becomes a constant value. Since the leakage current of the MOS transistor increases as the temperature rises, the threshold has to be increased by applying the substrate bias. In this case, there is a drawback such that the ON current of the MOS transistor conspicuously decreases by deterioration in mobility and increase in the threshold due to the temperature rise, and as a result, the processing speed of the circuit decreases. A filter having an inductance and a capacitance is formed outside of the chip and used to generate a supply voltage for delay control. Since it takes a few $\mu$ seconds until an output voltage of the filter is stabilized, stabilization time of a control signal is long, and the signal tends to be unstable. Consequently, control accuracy cannot be raised. When the capacitance and the inductance used for the filter are formed on the same chip on which a circuit to be controlled is also mounted, the fact that they occupy a large area becomes a problem.

Japanese Unexamined Patent Application No. 4-247653 discloses a concept such that a delay detector is provided to suppress delay variations of a gate circuit and the substrate bias of the gate circuit is controlled on the basis of the detection result.

Japanese Unexamined Patent Application No. 5-152935 also discloses a concept such that the substrate bias is controlled by using a capacitive filter and a charge pump to suppress device variations, thereby improving the yield.

Further, Japanese Unexamined Patent Application No. 8-274620 discloses a concept such that the delay amount of a circuit is detected by using a reference clock signal and the substrate bias of the circuit is controlled on the basis of the detection result.

DISCLOSURE OF INVENTION

It is an object of the invention to solve the problems of the conventional techniques.

More specifically, the inventors of the present invention have examined the problems in detail, which may occur when the conventional techniques are applied to a real semiconductor integrated circuit device, and propose the present invention. The present invention is to provide a semiconductor integrated circuit constructed by an MOS (MIS) transistor, in which characteristics fluctuation of a CMOS circuit is suppressed in short stabilization time and in a small area to thereby raise the control accuracy and improve the operating speed of the main circuit.

In order to achieve the subject, a semiconductor integrated circuit device as a representative embodiment of the invention includes a logic circuit for performing a predetermined process and a substrate-bias controller for supplying a substrate bias to an MIS transistor constructing the logic circuit. The logic circuit takes the form of an MIS transistor, and the substrate-bias controller supplies a suitable substrate bias to the MIS transistor in accordance with the characteristics fluctuation of the logic circuit. The threshold of the MIS transistor is changed by changing the substrate bias and the characteristics fluctuation of the logic circuit is suppressed. The characteristic of the logic circuit is detected as a delay, and the amount of change of the delay is converted into a digital amount. As a result, the substrate-bias controller can be constructed by a digital circuit, so that the stabilization time of the control voltage is shortened and the circuit scale is reduced.

A typical construction example of the invention is a semiconductor integrated circuit device including: a logic circuit for performing a predetermined process; a digital-to-analog converter for generating a substrate bias for controlling a threshold of an MIS transistor constructing the logic circuit; a voltage-controlled circuit for outputting a control signal in accordance with a delay signal; and a delay detector which can vary operating speed, characterized in that the delay detector receives a clock signal supplied from the outside and outputs a delay signal. The voltage-controlled circuit receives the delay signal of the delay detector and outputs a control signal according to delay time. The digital-to-analog converter receives the control signal supplied from the voltage-controlled circuit and generates a voltage according to the control signal, and the operating speed of the logic circuit and the delay detector is controlled by voltage supplied from the digital-to-analog converter.

In the example, since the main part of the controller deals with a digital signal, the circuit configuration is simple. The controller part and the circuit to be controlled can also be formed on different chips.

As a typical example of the circuits, the delay detector is comprised of a clock-duty modulator and a delay monitoring circuit. The voltage-controlled circuit is constructed by a delay comparator, the digital-to-analog converter is constructed by a substrate-bias generator, and the clock-duty modulator receives the clock signal from the outside and outputs a clock signal of an arbitrary clock duty ratio.

As another example, the delay monitoring circuit outputs an output signal of the clock-duty modulator with a predetermined delay. The delay comparator obtains a delay difference between the output signal of the clock-duty modulator and the output signal of the delay monitoring circuit by comparison, and outputs a signal according to the difference. The substrate-bias generator generates a substrate bias according to the output signal of the delay comparator, and the delay in both the logic circuit and the delay monitoring circuit is controlled by the substrate bias generated by the substrate-bias generator.

As another typical example, the delay detector is comprised of a divider and an oscillator, the voltage-controlled circuit is comprised of a phase-frequency detector and a phase-frequency controller, and the digital-to-analog converter is constructed by a voltage generator. The clock signal from the outside is supplied to the divider by which the frequency of the clock signal is optionally divided, the phase-frequency detector compares a phase and a frequency of a frequency-division signal of the divider with those of an output signal of the oscillator and produces an output signal according to the difference. The phase-frequency controller outputs a control signal in accordance with an output signal of the phase-frequency detector, the voltage generator generates a substrate bias in accordance with the control signal of the phase-frequency controller, and the operating speed of both the logic circuit and the oscillator is controlled by the substrate bias generated by the voltage generator.

Further, as a preferable example, a pMOS circuit and an nMOS circuit are separately controlled.

More specifically, the delay detector is comprised of a pMOS delay detector for detecting a change in the threshold of a pMOS transistor and an nMOS delay detector for detecting a change in the threshold of an nMOS transistor. Two voltage-controlled circuits and two digital-to-analog converters are prepared for the pMOS transistor and the nMOS transistor. The operating speed of the pMOS delay detector is controlled by a substrate bias for the pMOS transistor generated by the digital-to-analog converter for the pMOS transistor, and the operating speed of the nMOS delay circuit is controlled by the substrate bias for the nMOS transistor generated by the digital-to-analog converter for the nMOS transistor.

In the invention, by controlling the substrate bias of the transistor constructing the circuit, the threshold of the transistor is controlled, thereby controlling the operating speed of the circuit. In this case, when the threshold of the transistor decreases, what is called a subthreshold leakage current (leakage current between the gate and the source) increases. When the leakage current increases, the temperature of the circuit rises and the delay of the circuit increases.

In the case of decreasing the threshold of the transistor constructing the circuit to reduce the delay when the delay of the circuit is detected and increased, if no limiter is provided, the substrate bias is continuously applied in the direction of decreasing the threshold, so that there is a danger that an operating error in high temperature occurs.

According to the invention, there is consequently proposed a semiconductor integrated circuit device comprising a circuit to be controlled including at least one transistor, and a controller for controlling a substrate bias of the transistor in the circuit to be controlled, for changing the threshold of the transistor, wherein the controller has a limiter for controlling the substrate bias within a predetermined range.

As an example, the limiter has a leakage current detector for detecting leakage current of the transistor. When the leakage current increases to a predetermined value or larger, the substrate bias control of the controller is stopped.

In the case where the digital-to-analog converter for generating the substrate bias to control the threshold of the MIS transistor constructing the logic circuit is used, when the leakage current is increased to a predetermined value or larger, an output voltage of the digital-to-analog converter is fixed, thereby enabling the increase in the leakage current to be limited.

Further, in the invention, a detailed sequence to control the substrate bias is provided.

Specifically, in the invention, there is proposed a circuit device including a circuit to be controlled including a transistor and a controller for dynamically controlling a substrate bias of the transistor, characterized in that the circuit device performs operations in the following order:

(1) setting of the substrate bias of the transistor to a predetermined value,
(2) application of a supply voltage to the transistor, and
(3) dynamic control of the substrate bias of the transistor.

In this case, the controller can comprise a monitoring circuit for monitoring delay in the controlled circuit and a substrate-bias generator for controlling the substrate bias of the transistor on the basis of a signal from the monitoring circuit.

More specifically, there is provided a semiconductor integrated circuit device comprising a logic circuit for performing a predetermined process, two voltage stabilizers, a control voltage stable-state detector, a reset cancellation circuit, and an operation/non-operation switching circuit, characterized in that the substrate bias is supplied after the device is started. The first voltage stabilizer supplies a supply voltage after the substrate bias becomes stable, the second voltage stabilizer supplies a control signal to the semiconductor integrated circuit after the supply voltage becomes stable, and the control voltage stable-state detector detects the stable state of an output voltage for control of the semiconductor integrated circuit. The reset cancellation circuit sends a reset cancellation signal to the logic circuit when the control voltage stable-state detector detects the stable state to thereby cancel the reset state of the logic circuit and to allow the operation to start, and the operation/non-operation switching circuit switches validity/invalidity of the control of the semiconductor integrated circuit in accordance with the operation/non-operation switching signal, thereby preventing an erroneous operation of the logic circuit at the time of start-up or during operation.

In association with the increase in the functions of the integrated circuit device, there is a case such that it is effective to divide the circuit into a plurality of blocks and change the operating speed and the operating voltage block by block.

According to another mode of the invention, there is provided a semiconductor integrated circuit device comprising a logic circuit having at least first and second blocks, first and second speed controllers, and a clock generator, characterized in that different supply voltages are supplied to the first and second blocks, and the first and second speed controllers control the operating speeds of the logic circuit in the blocks in accordance with the supply voltages applied to the respective blocks.

As another mode of the invention with emphasis on reducing the power consumption of the circuit, there is provided a semiconductor integrated circuit device comprising a first circuit block to be controlled and a second circuit block to be controlled, characterized in that each of the circuits to be controlled is provided with a switch, and the supply of power to a transistor included in each of the circuits to be controlled is controlled by the switch. Each of the circuits to be controlled is provided with a controller, and the substrate bias of the transistor included in each of the circuits to be controlled is controlled by the controller.

The switch is controlled by, for example, a mode switching signal. By turning off the switch when the circuit is not operating, the leakage current of the FET in the circuit can be reduced. When the circuit is operating, the threshold of the FET is controlled by a dynamic control of the substrate bias of the transistor as described above, and the operating speed and the power consumption of the circuit can be set to proper values. For example, the controller detects the delay of the circuit to be controlled and controls the substrate bias of the transistor on the basis of the detection result.

It is also possible to apply different supply voltages to the circuits to be controlled.

As a layout of the circuit, the speed controller is comprised of the delay detector and the controller. When the delay detector is disposed in the block to be controlled, particularly, in the center of the block, the operating speed can be accurately detected.

As another mode of the invention, there is provided a semiconductor integrated circuit device comprising a logic circuit for performing a predetermined process, an input/output circuit for transmitting a signal to the logic circuit, and a speed controller for controlling the operating speed of the circuit, characterized in that the signal transmitting speed of the input/output circuit is controlled by the speed controller. Specifically, the speed controller controls the substrate bias of the transistor constructing the input/output circuit to change the threshold, thereby controlling the operating speed.

As another example, there is provided a semiconductor integrated circuit device comprising a logic circuit for performing a predetermined process, a clock generator for supplying a clock signal to the logic circuit, and a speed controller for controlling the operation speed of the circuit, characterized in that the clock generator changes the frequency of the clock signal by a frequency control signal while the logic circuit is operating, and the speed controller controls the operating speed of the logic circuit in accordance with a change in the clock signal.

There is also provided a semiconductor integrated circuit-device comprising a logic circuit having at least first and second blocks, first and second speed controllers, and a clock generator, characterized in that clock signals of different frequencies are supplied to the first and second blocks, and the first and second speed controllers control the operating speeds of the logic circuit in the blocks in accordance with the frequencies of the clock signals supplied to the respective blocks.

BEST MODE FOR CARRYING OUT OF THE INVENTION

Embodiments of the invention will be described hereinbelow with reference to the drawings.

Figure 1:
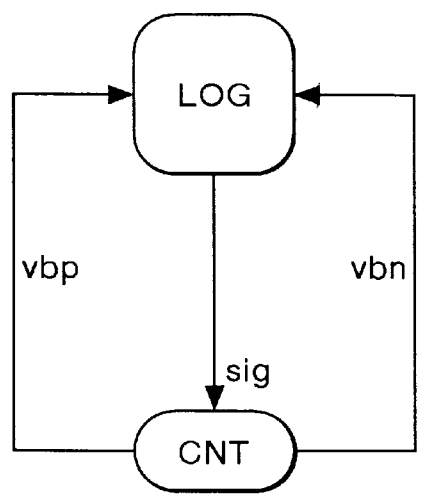
FIG. 1 is a diagram showing the configuration of a first embodiment of the invention.

FIG. 1 is a diagram showing the fundamental concept of the invention. A main circuit LOG transmits a detected signal sig according to the operating speed of the circuit to a substrate-bias controller CNT. The substrate-bias controller CNT supplies both a substrate vias vbp for a p-channel type MOSFET and a substrate vias vbn for an n-channel type MOSFET to the main circuit LOG. The main circuit LOG is constructed by an MOS transistor. By controlling the substrate bias of the MOS transistor, a threshold voltage is controlled.

With such a construction, even when the characteristics of the MOS transistor fluctuate, due to variations in temperature and supply voltage or variations in the fabrication process of the MOS transistor, by controlling the substrate bias to control the threshold voltage of the MOS transistor, the operating speed can be made always constant. Further, the MOS transistor is fabricated so that it's threshold is preliminarily set to be lower than the limit value determined by a desired maximum leakage current, and the operating speed of the main circuit is controlled to be constant by the substrate bias control, thereby enabling substantial high speed processing to be realized. With such a construction, when the main circuit is in a suspended mode, the leakage current is reduced by increasing the threshold of the main circuit, thereby enabling the power consumption to be reduced.

Figure 20:
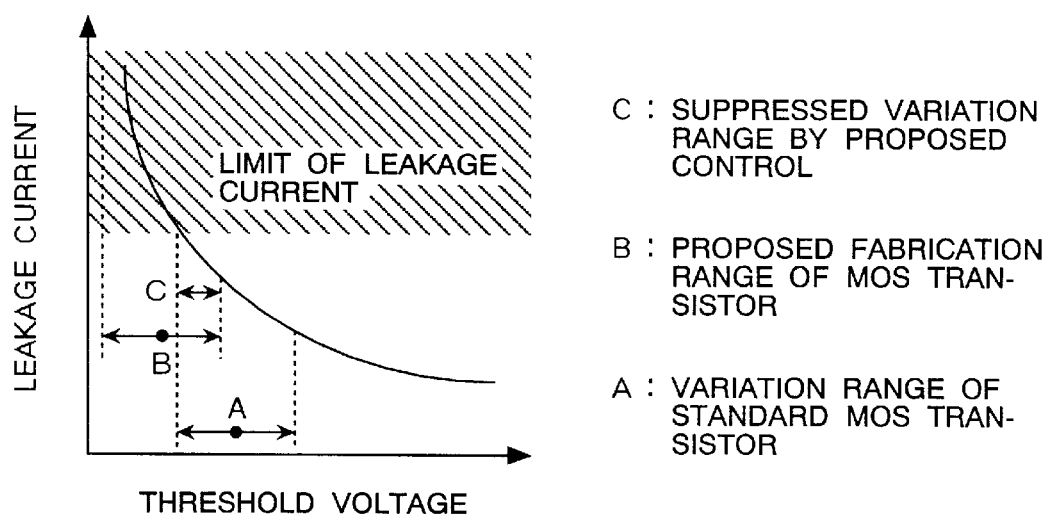
FIG. 20 is a diagram showing the relation between threshold and leakage current.

FIG. 20 shows the relation between the threshold of the MOS transistor and the leakage current. In a standard MOS transistor, it is designed with the threshold at point A and the range of variation caused by a process or the like does not exceed the desired limit of a leakage current. In the invention, by decreasing the threshold to point B and applying the substrate bias, even when the threshold changes, the range of variation does not exceed the limit of leakage current.

Figure 16:
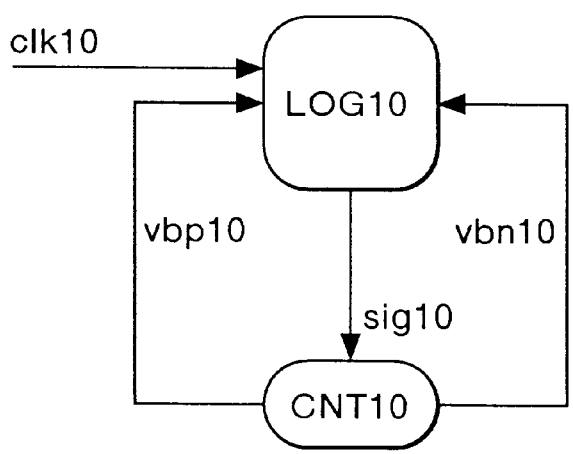
FIG. 16 is a diagram showing the configuration of another embodiment of the invention.

FIG. 16 is a diagram showing another embodiment of the invention.

A main circuit LOG10 receives a clock signal clk10 from the outside and generates a detected signal sig10 in accordance with the operation frequency of the clock. A substrate-bias controller CNT10 receives the detected signal sig10 and supplies substrate biases vbp10 and vbn10 to the main circuit LOG10. The substrate-bias controller CNT10 controls the substrate biases vbp10 and vbn10 so that the operating speed of the main circuit LOG10 follows a change in the clock signal clk10. As a result, the operating speed of the main circuit can be changed according to the external clock.

Figure 17:
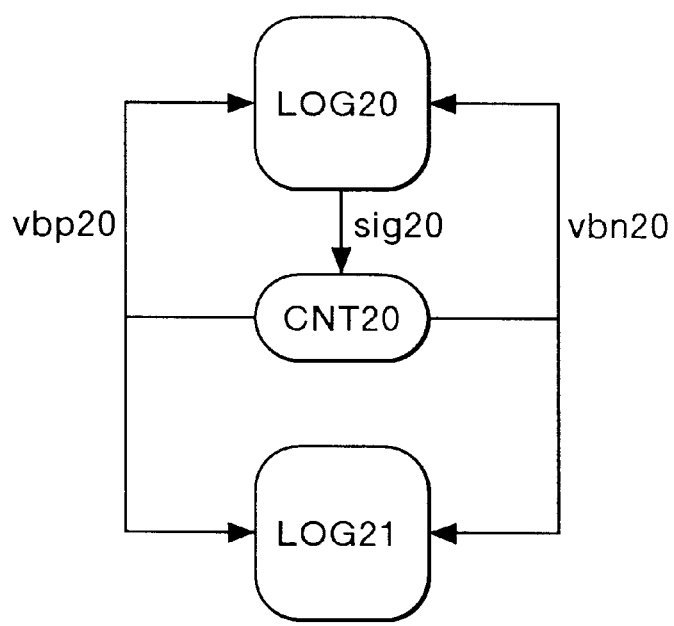
FIG. 17 is a diagram showing the configuration of another embodiment of the invention.

FIG. 17 is a diagram showing another embodiment of the invention. A main circuit LOG20 outputs a circuit characteristics detected signal sig20. A substrate-bias controller CNT20 generates substrate biases vbp20 and vbn20 in response to the detected signal sig20. The substrate biases vbp20 and vbn20 are supplied to both the main circuit LOG20, which has detected the characteristics and the main circuit LOG21. With such a configuration, the characteristics fluctuation in the main circuits LOG20 and LOG21 can be suppressed.

Figure 18:
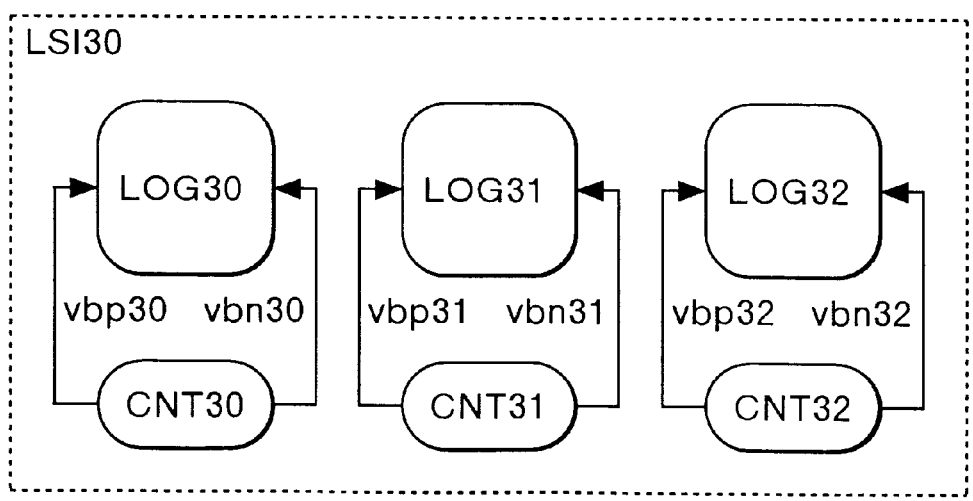
FIG. 18 is a diagram showing the configuration of another embodiment of the invention.

FIG. 18 is a diagram showing another embodiment of the invention. As shown in the diagram, when a plurality of main circuits LOG30 to LOG32 construct one semiconductor integrated circuit LSI30, by mounting controllers CNT30 to CNT32 of the embodiment for the respective main circuits, local characteristics fluctuation in the semiconductor integrated circuit can be suppressed, and the power control of each local part can also be performed.

Figure 2:
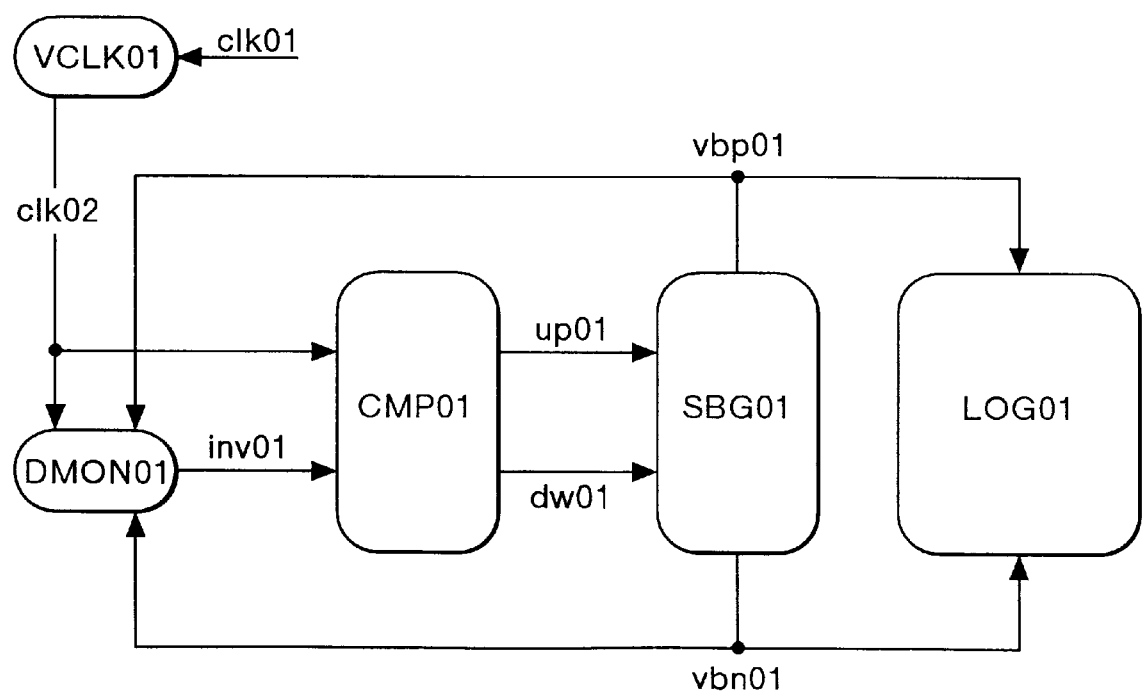
FIG. 2 is a diagram showing the detailed configuration of the embodiment of the invention.

FIG. 2 is a diagram showing a detailed embodiment of the invention. A clock signal clk01 from the outside is supplied to a clock-duty modulator VCLK01. On the basis of the clock signal clk01, the clockduty modulator VCLK01 generates a clock signal clk02 of a different duty ratio. A delay monitoring circuit DMON01 receives the clock signal clk02 from the clock-duty modulator VCLK01 and outputs a delayed output signal inv01 which is delayed by predetermined delay. A delay comparator CMP01 detects a phase difference, that is, a delay difference between the clock signal clk02 from the clock-duty modulator VCLK01 and the delayed output signal inv01 from the delay monitoring circuit DMON01, and compares the difference with a predetermined set value. When the delay is advanced as compared with the predetermined design value, the delay comparator CMP01 outputs an up01 signal. When the delay is behind, the delay comparator CMP01 outputs dw01. A substrate-bias generator SBG01 generates two kinds of biases: a substrate bias vbp01 for a p-channel type MOSFET, and a substrate bias vbn01 for an n-channel type MOSFET. Each time the up01 signal is received from the delay comparator CMP01, the substrate-bias generator SBG01 increases the voltage of vbp01 on a predetermined voltage unit basis and decreases the voltage of vbn01 on a predetermined voltage unit basis. Each time the dw01 signal is received from the delay comparator CMP01, the substrate-bias generator SBG01 decreases the voltage of vbp01 on a predetermined voltage unit basis and increases the voltage of vbn01 on a predetermined voltage unit basis. The resultant substrate bias is applied to the substrate of MOSFET of the delay monitoring circuit DMON01.

The delay monitoring circuit DMON01 is comprised of an n-channel type MOSFET and a p-channel type MOSFET formed on the semiconductor substrate, and is constructed so that the substrate bias of the MOSFET is changed by the substrate bias signal from the substrate bias generator SBG01. As will be described hereinafter, by changing the threshold voltage in accordance with a change in the substrate bias, the delay is changed.

When the delay difference between the clock signal clk02 and the delayed output signal inv01 becomes equal to the predetermined design value, the delay comparator CMP01 does not output the up01 and dw01 signals. When no output signal is supplied from the delay comparator CMP01, the substrate bias generator SBG01 determines that the substrate-bias voltage value is decided, and applies the determined substrate bias to the substrate of the main circuit LOG01. By controlling the substrate bias of the MOS transistor, the threshold voltage is controlled.

With such a construction, the threshold voltage of the MOS transistor is controlled by controlling the substrate bias, thereby enabling the operating speed to be always constant, even when the operation environment and the like changes. With such a construction, when the main circuit is in the suspended mode, the threshold of the main circuit is increased to reduce the leakage current, thereby enabling the power consumption to be reduced.

Figure 3:
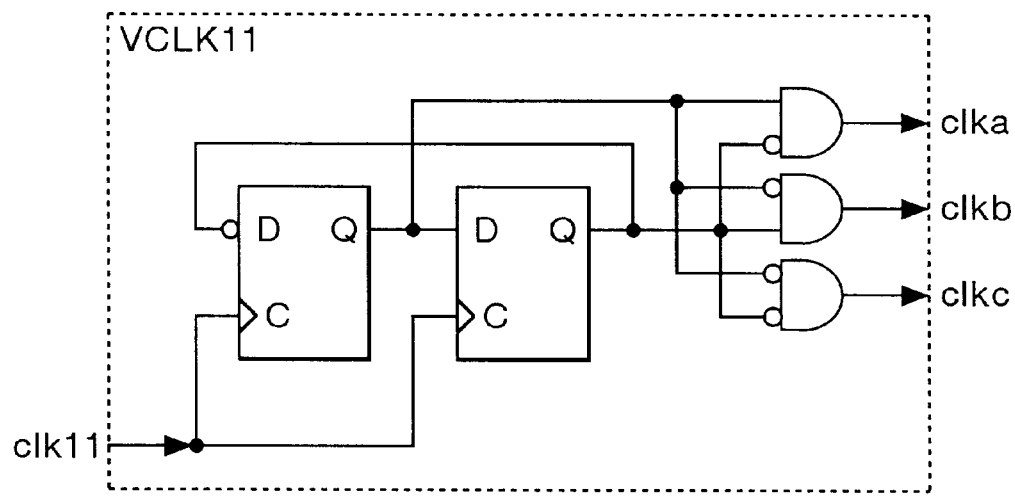
FIG. 3 is a diagram of a clock-duty modulator.
Figure 4:
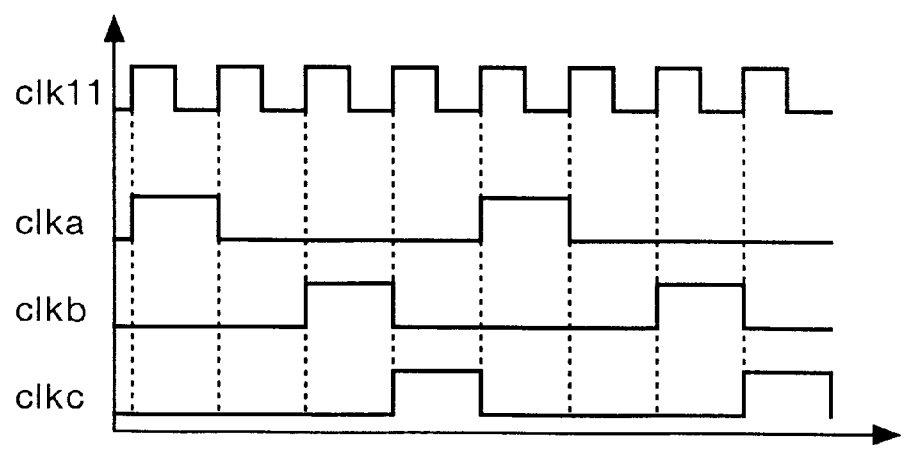
FIG. 4 is an output waveform chart of the clock-duty modulator.

FIG. 3 is a diagram showing an embodiment of the clock-duty modulator. By combining a flip-flop and an AND gate, three kinds of clocks clka, clkb, and clkc of different phases can be generated from a clock input clk11. The waveforms of the clock signals are shown in FIG. 4.

Figure 5:
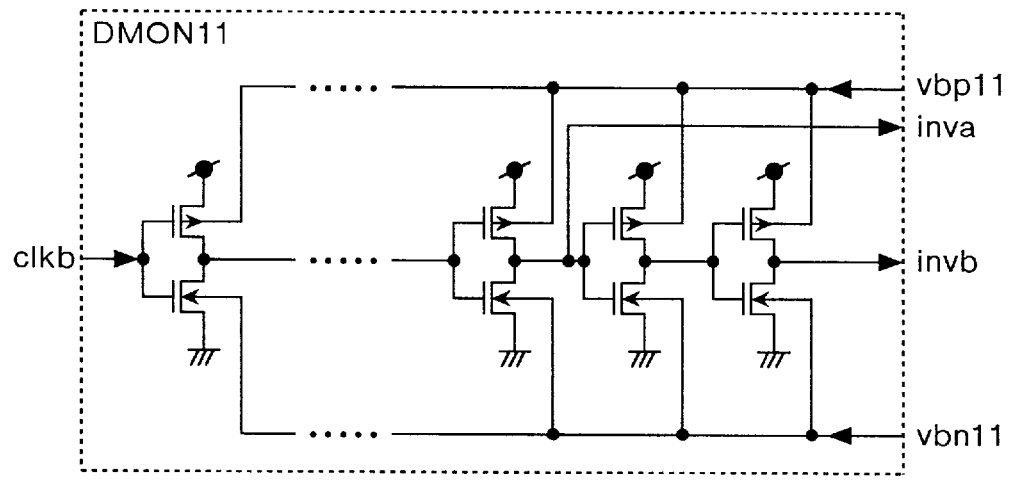
FIG. 5 is diagram of a delay monitoring circuit.

FIG. 5 is a diagram showing an embodiment of the delay monitoring circuit. The delay monitoring circuit is obtained by connecting inverters in series. The clock output clkb of the clock-duty modulator is supplied to the inverter at the first stage. Output signals invb and inva are taken from the last stage inverter at the last stage and the inverter two stages before the last stage, The threshold of each inverter is changed by controlling the substrate bias by the substrate bias signals vbp11 and vbn11, so that the delay difference between each of the signals inva and invb and the input signal clkb can be controlled.

Figure 6:
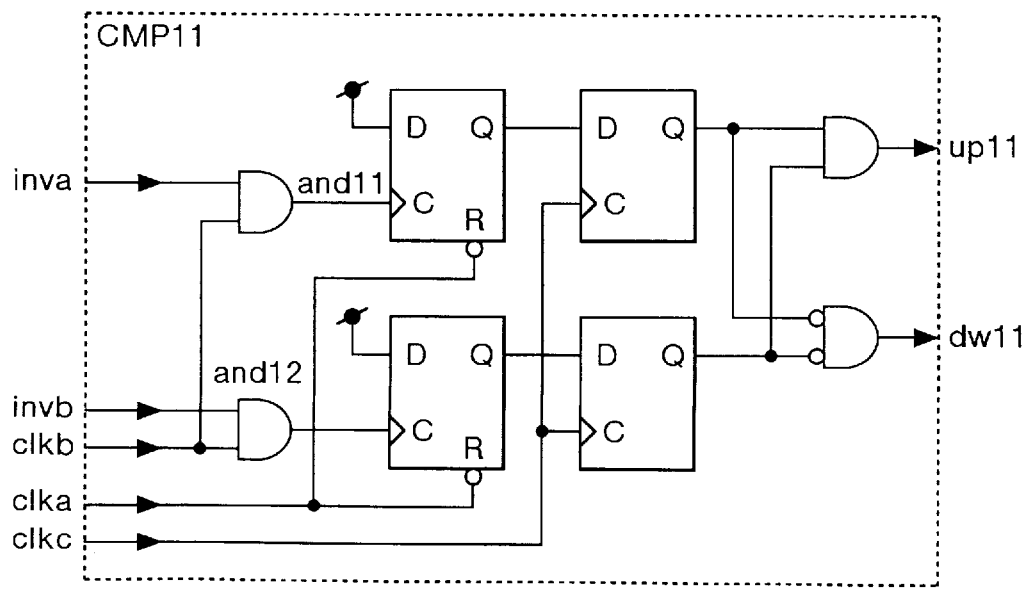
FIG. 6 is a diagram of a delay comparator.

FIG. 6 is a diagram showing an embodiment of the delay comparator. The delay comparator comprises flip-flops and AND gates. The clock outputs clka, clkb and clkc from the clock-duty modulator and the delay output signals inva and invb of the delay monitoring circuit are received and up11 and dw11 signals are outputted. When the delay of the delay monitoring circuit is equal to the design value, an AND gate output and11 of inva and clkb is generated and an AND gate output and12 of invb and clkb is not generated. In this case, both the up11 and dw11 signals are not outputted. When the characteristics fluctuate due to characteristics fluctuation caused by a fabrication process or a change in the environment and the delay of the delay monitoring circuit is advanced, the up11 signal is outputted. When the delay of the delay monitor is behind, the dw11 signal is outputted.

Figure 7:
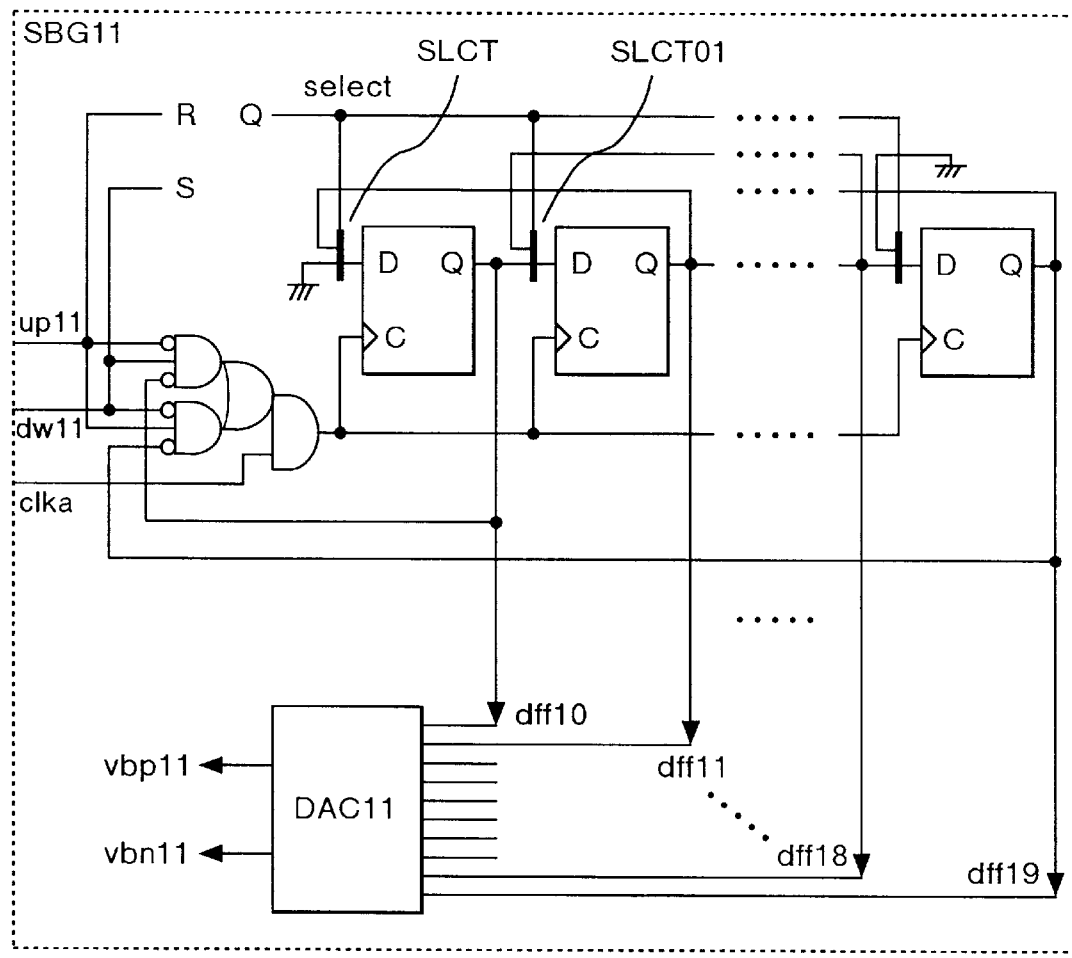
FIG. 7 is a diagram of a substrate-bias generator.

FIG. 7 is a diagram showing an embodiment of the substrate-bias generator, which comprises an AND gate, an OR gate, a flip-flop, a selector, and a digital-to-analog converter. The flip-flops construct a register whose output position can be changed to "up" or "down". Only a signal in a resistor position corresponding to the desired substrate bias is outputted.

In the initial state, an output signal is generated from dff15 as a central register output. The up11 signal and the dw11 signal from the delay comparator are received and the output position of the register is changed to "up" or "down" in accordance with the clock signal clka of the clock-duty modulator. A digital-to-analog converter DAC11 generates the substrate bias vbp11 for p-channel type MOSFET and the substrate bias vbn11 for n-channel type MOSFET in accordance with the output position dff10 to dff19 of the register. Each time the up11 signal is received, the register position of the register output is changed one by one, in the direction extending from dff10 to dff19. When the dw11 signal is received, the register position of the register output is shifted one by one in the direction from dff19 to dff10. Each time the register output is shifted by the up11 signal, the substrate bias output changes the substrate bias by 0.2V. In the case where the supply voltage is 1.8V, when the supply voltages of −1.8V and 3.6V are supplied to the DAC11, the vbp11 signal is generated at the interval of 0.2V in the range from 1.8V to 3.6V and the vbn11 signal is generated at the interval of 0.2V in the range from 0.0V to −1.8V.

When the delay of the delay monitoring circuit is advanced as compared with the design value, the substrate-bias generator receives the up11 signal. Consequently, the register output increases step by step, and the substrate bias increases 0.2V each by the vbp11 signal and decreases 0.2V each by the vbn11 signal. By applying the resultant substrate bias to the MOSFET substrate of the delay monitoring circuit, the monitor delay is slowed. When the delay of the delay monitoring circuit is behind the design value, the substrate-bias generator receives the dw11 signal. Consequently, the register output decreases step by step, and the substrate bias decreases 0.2V each by the vbp11 signal and increases 0.2V each by the vbn11 signal. By applying the resultant substrate bias to the MOSFET substrate of the delay monitoring circuit, the monitor delay is advanced.

Figure 8:
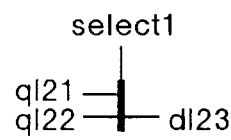
FIG. 8 is a diagram of a selector.
Figure 9:
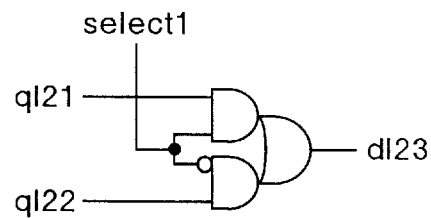
FIG. 9 is a diagram of a selector.

FIGS. 8 and 9 are diagrams each specifically showing the selector in the substrate-bias generator. On the basis of a select1 input signal of the selector, the register signal of the substrate-bias generator switches the up and down directions.

Figure 19:
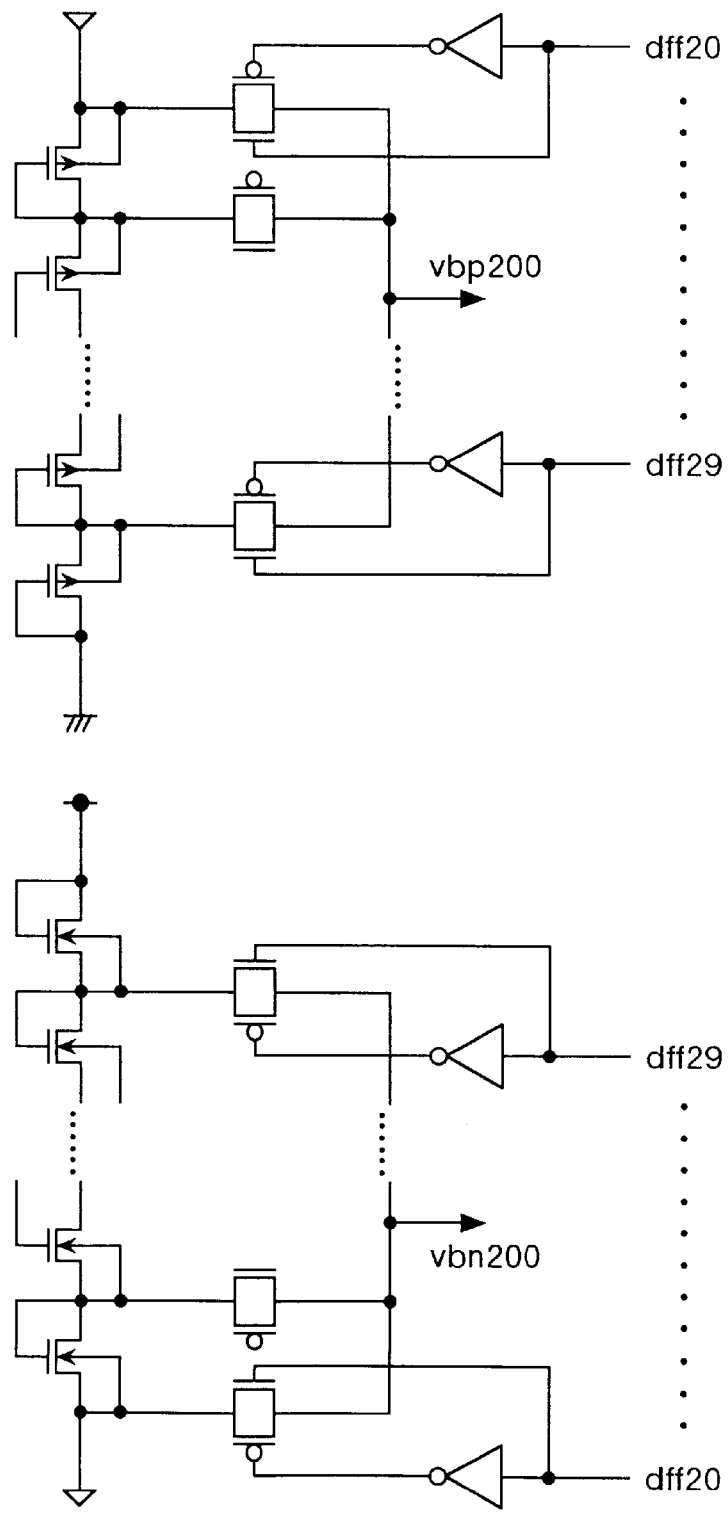
FIG. 19 shows a digital-to-analog converter.

FIG. 19 is a diagram specifically showing the digital-to-analog converter. Substrate biases vbp200 and vbn200 corresponding to the register outputs dff20 to dff29 are generated.

Figure 10:
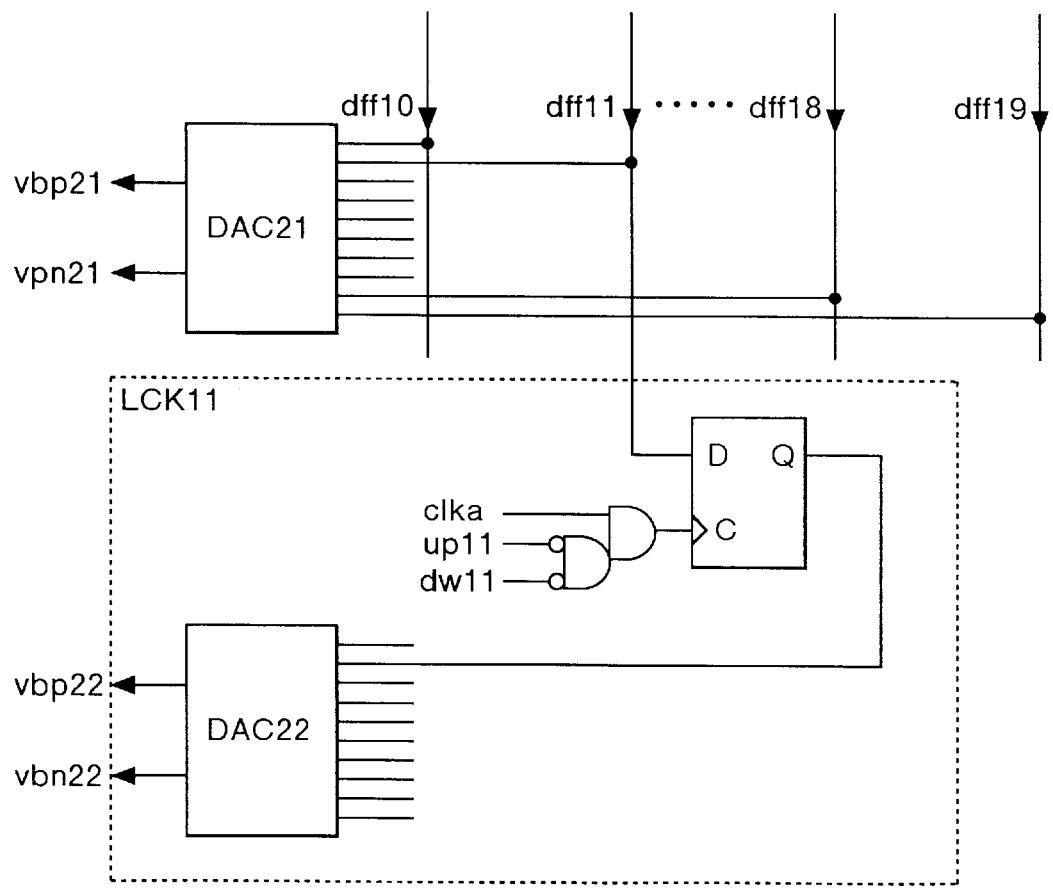
FIG. 10 is a diagram of a lock detector.

FIG. 10 shows an embodiment of the lock detector. The substrate bias output of the substrate-bias generator is always applied to the MOSFET substrate in the delay monitoring circuit. When the characteristics of the delay monitoring circuit fluctuate, the bias voltage is changed by each clock until the substrate bias voltage is determined. In order to apply the substrate bias for controlling the main circuit after the substrate bias is determined, a lock detector may be inserted. Outputs vbp21 and vbn21 of the digital-to-analog converter DAC21, which is directly connected to the shift register outputs dff10 to dff19 in the substrate-bias generator, are connected to the MOSFET substrate in the delay monitoring circuit. The lock detector LCK11 receives the shift register outputs dff10 to dff19 and clka, up11, and dw11 signals, detects that the substrate-bias voltage value is locked through the AND gate and flip-flop, and transmits the signals to the digital-to-analog converter DAC22. The digital-to-analog converter DAC22 outputs the substrate biases vbp22 and vbn22 and controls the substrate bias of the MOSFET substrate in the main circuit.

Figure 11:
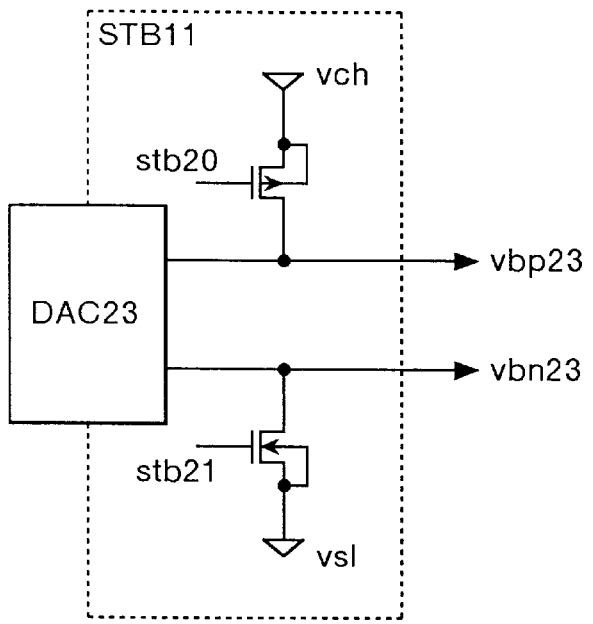
FIG. 11 is a diagram of a standby circuit.
Figure 12:
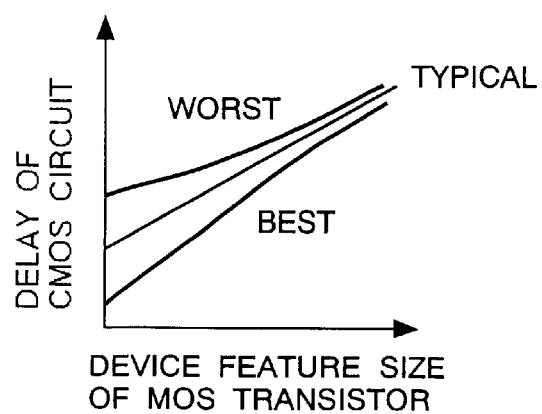
FIG. 12 is a diagram showing the relation between device feature size and gate delay.

FIG. 11 shows an embodiment of a standby circuit. When the main circuit is in the suspended mode, by maximizing the substrate bias in the p-channel type MOSFET and by minimizing the substrate bias in the n-channel type MOSFET, both the leakage current and the power consumption can be reduced. Substrate bias outputs vbp23 and vbn23 from a digital-to-analog converter DAC23 in the substrate-bias generator are generated as shown in the diagram. The source of the pMOS is connected to the maximum substrate bias vch and the source of the nMOS is connected to the minimum substrate bias vs1. When the supply voltage is 1.8V, vch is 3.6V and vs1 is −1.8V, a suspension signal stb21 and an stb20 signal having the phase opposite to that of stb21 are supplied to the gates of the nMOS and pMOS, respectively.

Figure 13:
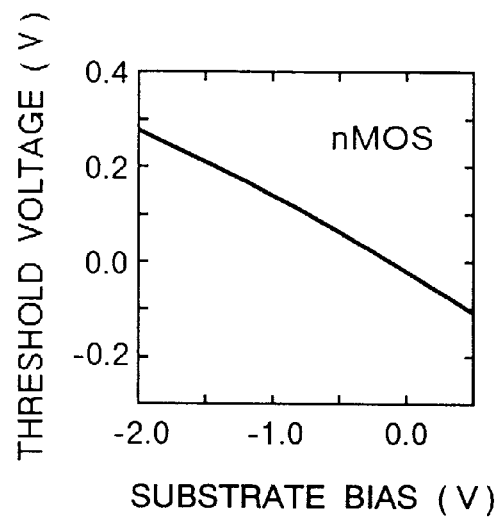
FIG. 13 is a diagram showing the relation between the substrate bias and the threshold voltage.
Figure 14:
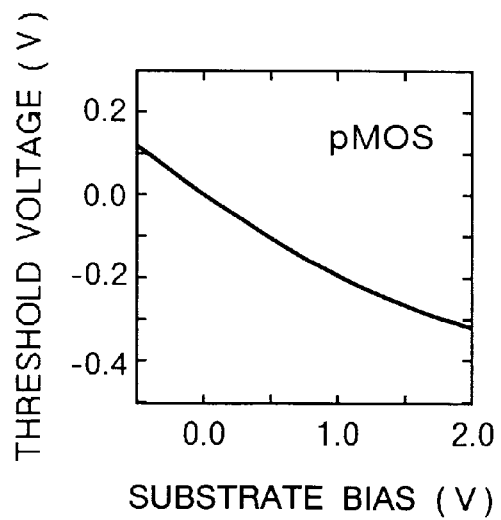
FIG. 14 is a diagram showing the relation between the substrate bias and the threshold voltage.
Figure 15:
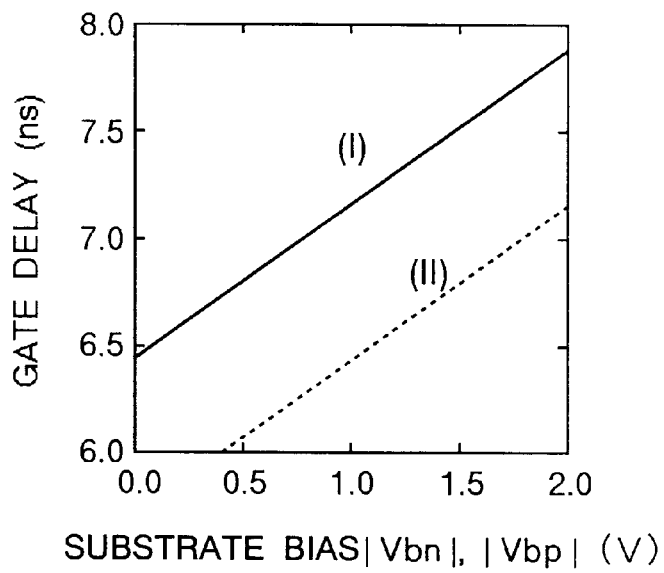
FIG. 15 is a diagram showing the relation between the substrate bias and gate delay.

Both FIGS. 13 and 14 show the relation between the substrate-bias voltage and the threshold voltage of the MOS transistor. FIG. 13 shows the case of the nMOS. FIG. 14 illustrates the case of the pMOS. The threshold of the MOS transistor changes according to the substrate bias as shown in both FIGS. 13 and 14. Consequently, when a gate like an inverter is formed by using an MMOS transistor and a pMOS transistor, as shown in FIG. 15, the larger the absolute value of the substrate bias is, the longer the delay is. Consequently, by controlling the substrate bias, the delay of the CMOS circuit can be maintained to be always constant. When the characteristics of (II) are given to a CMOS circuit having the characteristics of (I) by decreasing the threshold preliminarily by a process, by increasing or decreasing the bias voltage around 1.0V of the substrate bias as a center, the operating speed can be made faster or slower as compared with that of the initial CMOS circuit.

When no compensation is performed, the delay fluctuation in the CMOS circuit exists at about 45%. In a method of controlling the leakage current to be constant, a change in temperature cannot be dealt with, so that the fluctuation in delay becomes 60% and the range is rather widened. In the method of suppressing the delay fluctuation by the supply voltage control, the range of variation is suppressed to 36%. According to the invention, the delay can be suppressed to 32%.

Figure 21:
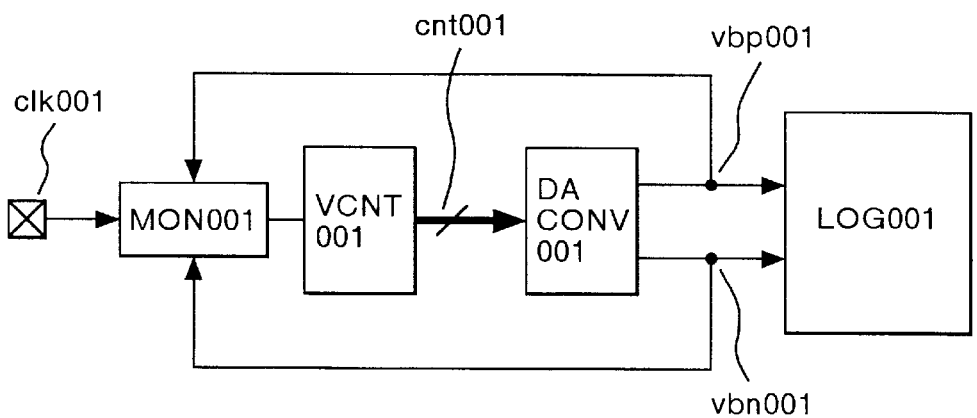
FIG. 21 is a diagram showing the configuration of another embodiment of the invention.

FIG. 21 is a diagram showing another embodiment of the invention. A delay detector MON001 receives a clock signal clk001 and outputs a delayed signal. On the basis of the delayed signal, a voltage-controlled circuit VCNT001 generates a control signal cont001 to a digital-to-analog converter DACONV001 as, for example, a 10-bit signal. The digital-to-analog converter DACONV001 generates a substrate bias vbp001 for a pMOS transistor and a substrate bias vbn001 for an nMOS transistor in accordance with the control signal, and supplies them to the delay detector MON001 and a main circuit LOG001. The delay detector MON001 can change a signal transmission delay by the substrate biases vbp001 and vbn001, and the voltage controlled circuit VCNT001 generates a control signal so that the digital-to-analog converter DACONV001 generates a substrate bias signal to make the delay in an output signal of the delay detector MON001 always constant. Consequently, the operating speed of the delay detector MON001 and the main circuit LOG001 becomes always constant.

Figure 22:
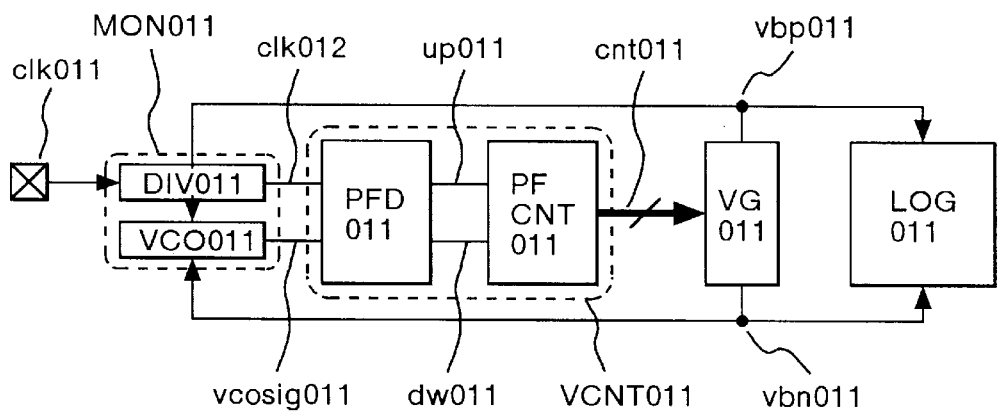
FIG. 22 is a diagram showing the configuration of another embodiment of the invention.

FIG. 22 is a diagram specifically showing an embodiment of the invention. A delay detector MON011 is comprised of a divider DIV011 and a threshold-voltage controlled oscillator VCO011. The divider DIV011 divides the frequency of a clock signal input clk011 and outputs a clock signal clk012. The threshold-voltage controlled oscillator VCO011 can change the oscillation frequency by substrate bias signals vbp011 and vbn011, and generates an oscillation output signal vcosig011. A voltage-controlled circuit VCNT011 is comprised of a phase-frequency detector PFD011 and a phase-frequency controller PFCNT011. The phase-frequency detector PFD011 receives an output clock signal clk012 of the divider DIV011 and an oscillation output vcosig011 of the threshold-voltage controlled oscillator VCO011, detects a frequency difference and a phase difference between the two signals, and generates an up signal up011 or a down signal dw011 in accordance with the difference. The phase-frequency controller PFCNT011 converts the up signal up011 or down signal dw011 to, for example, a 10-bit control signal control. A voltage generator VG011 generates a substrate bias vbp011 for the pMOS transistor and a substrate bias vbn011 for the nMOS transistor in accordance with the control signal cnt011, and supplies them to the substrates of the threshold-voltage controlled oscillator VCO011 and the main circuit LOG011. A voltage-controlled circuit VCNT011 controls the substrate bias, so that the output vcosig011 of the threshold-voltage controlled oscillator VCO011 is synchronized with the output clk012 of the divider DIV011 with respect to the frequency and phase. The threshold-voltage controlled oscillator VCO011 and the main circuit LOG011 operate always at the same operating speed in correspondence with the clock signal input clk011.

Figure 23:
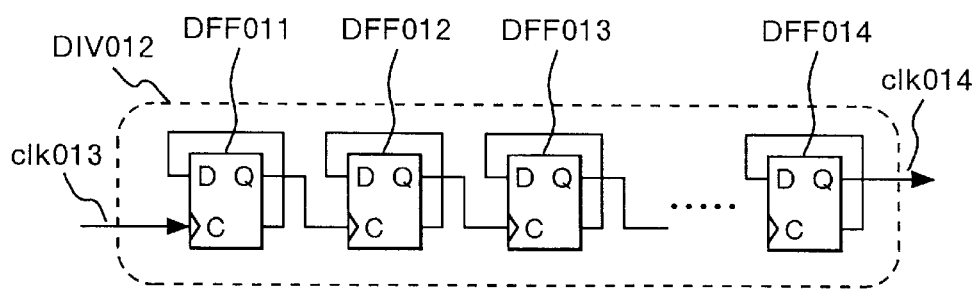
FIG. 23 is a diagram of a divider.

FIG. 23 is a diagram showing an embodiment of the divider. A divider DIV012 is constructed by connecting a plurality of D-type flip flops (DFF011 and the like) as shown in the diagram. The divider generates an output signal clk014 by reducing the frequency of an input clock signal clk013 by half when one D-type flip flop is used or by reducing the frequency to ¼ when two D-type flip flops are used.

Figure 24:
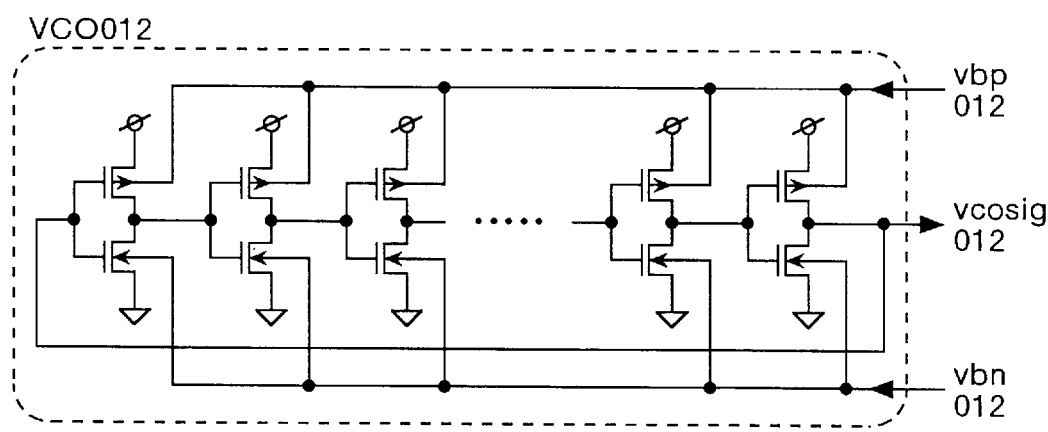
FIG. 24 is a diagram of a threshold-voltage controlled oscillator.
Figure 25:
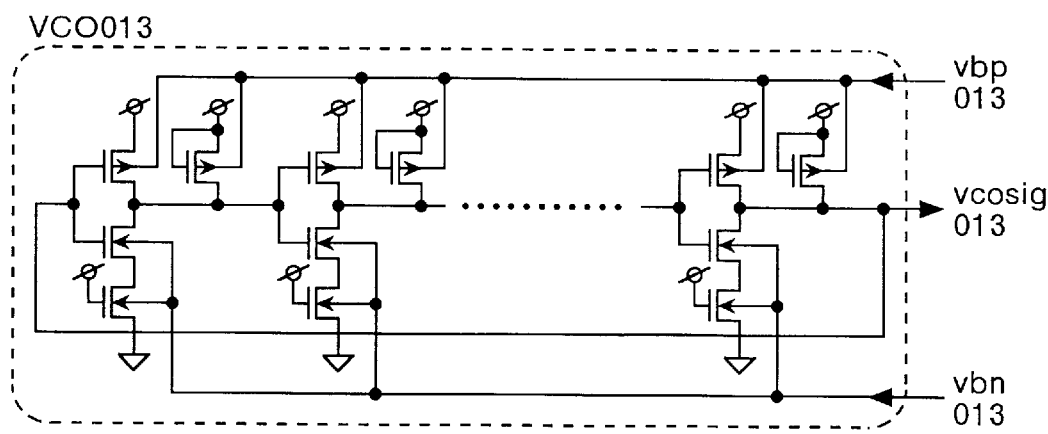
FIG. 25 is a diagram of a threshold-voltage controlled oscillator.
Figure 26:
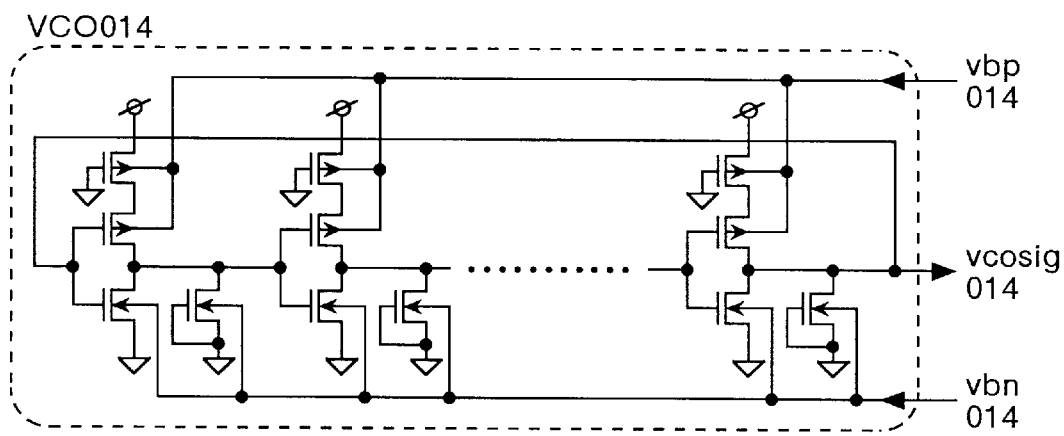
FIG. 26 is a diagram of a threshold-voltage controlled oscillator.

FIGS. 24, 25, and 26 are diagrams showing embodiments of the threshold-voltage controlled oscillator. The oscillation frequency of the threshold-voltage controlled oscillator can be varied by substrate bias signals vbp012, vbp013, vbp014, vbn012, vbn013, and vbn014, and outputs clock signals vcosig012, vcosig013, and vcosig014. VCO012 is constructed by using inverter circuits, VCO013 is constructed by using NAND circuits, and VCO014 is constructed by using NOR circuits.

Figure 27:
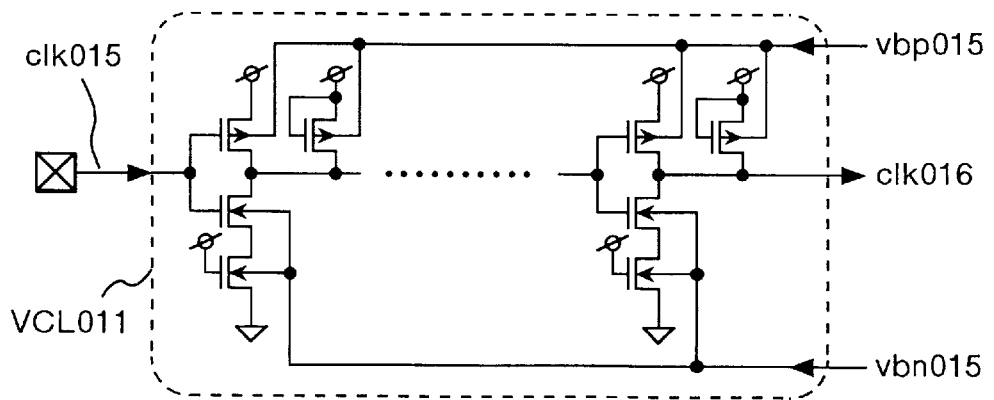
FIG. 27 is a diagram of a threshold-voltage controlled delay line circuit.
Figure 28:
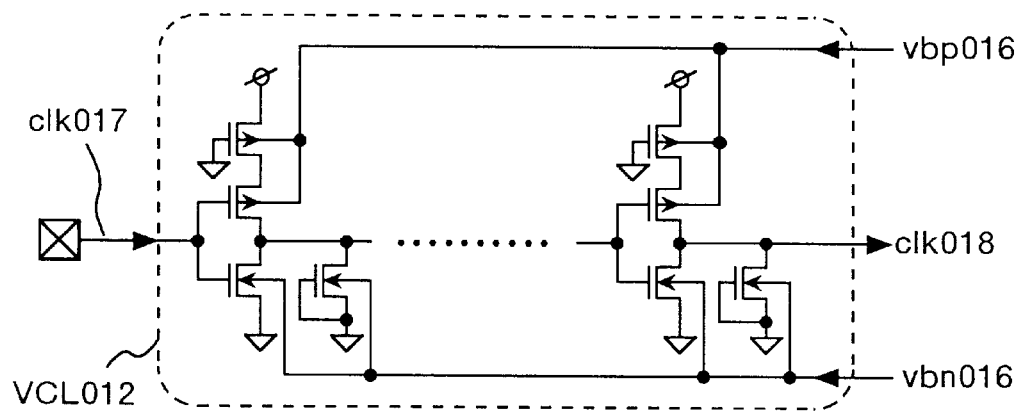
FIG. 28 is a diagram of a threshold-voltage controlled delay line circuit.

FIGS. 27 and 28 are diagrams showing embodiments of a threshold-voltage controlled delay line. The delay comparator 5 can be similarly constructed like VCL011 or VCL012 by using an NAND circuit or an NOR circuit.

Figure 29:
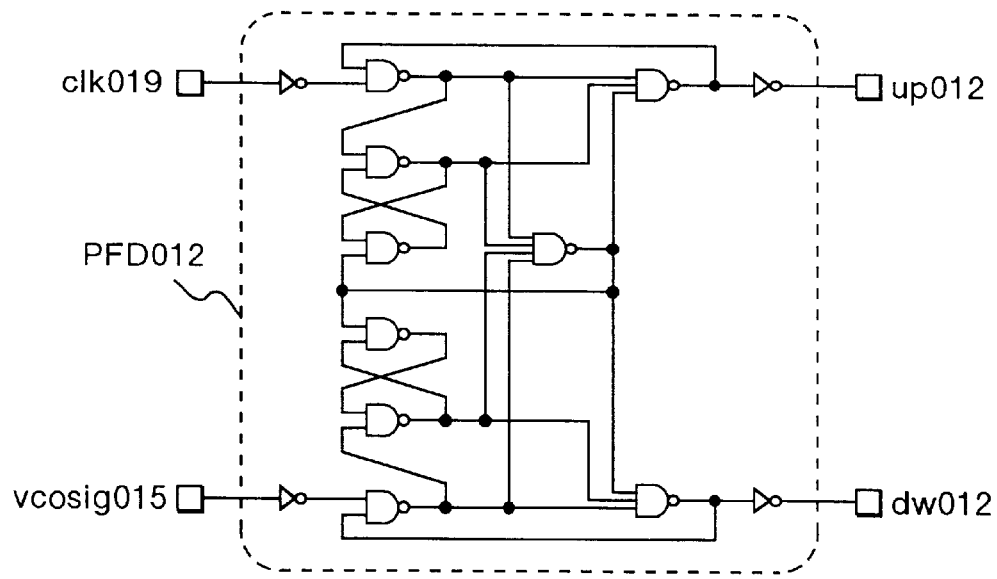
FIG. 29 is a diagram of a phase-frequency detector.

FIG. 29 is a diagram showing an embodiment of the phase-frequency detector. A phase-frequency detector PFD012 detects a phase difference and a frequency difference between a clock signal clk019 and an oscillation output vcosig015. When the clock signal clk019 leads, an up signal up012 is generated. When the oscillation output vcosig015 leads, a down signal dw012 is generated.

Figure 30:
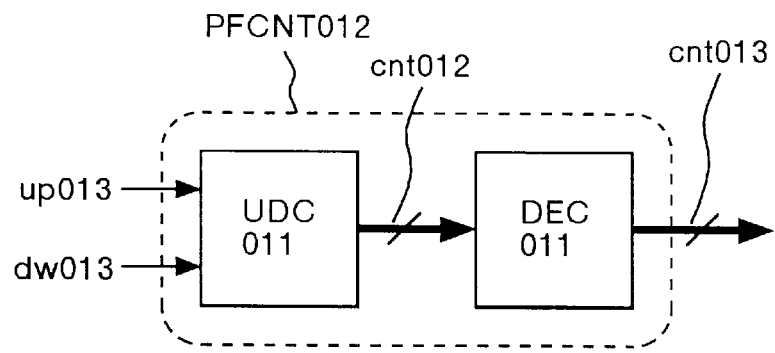
FIG. 30 is a diagram of a phase-frequency controller.

FIG. 30 is a diagram showing an embodiment of the phase-frequency controller. A phase frequency controller PFCNT012 is comprised of an up-down counter UDC011 and a decoder DEC011. When an up signal up013 is received, the up-down counter UDC011 increases an output signal cnt012 by "1" in binary number. When a down signal is received, the up-down counter UDC011 decreases an output signal by "1" and the result of the addition or substraction is outputted as a control signal cnt012 of about 4 bits. The decoder DEC011 decodes the control signal cnt012 and generates a control signal cnt013 of about 8 bits.

Figure 31:
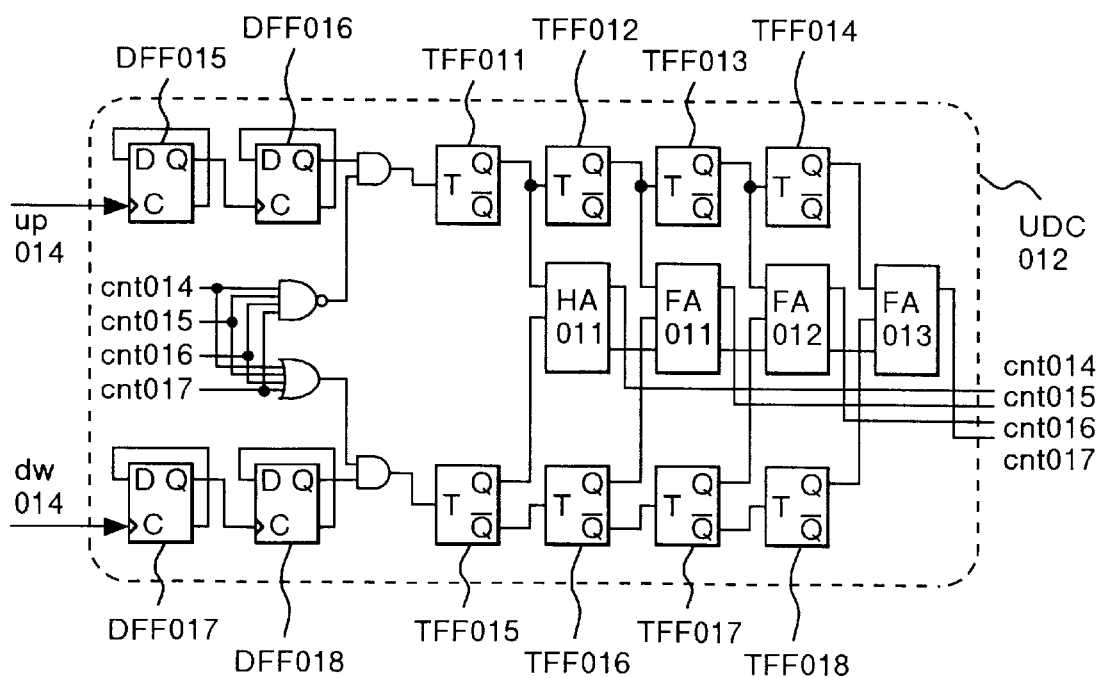
FIG. 31 is a circuit diagram of an up-down counter.

FIG. 31 shows the configuration of the up-down counter which comprises D-type flip flops DFF015, DFF016, DFF017, and DFF018, T-type flip flops TFF011, TFF012, TFF013, TFF014, TFF015, TFF016, TFF017, and TFF018, a half adder HA011, full adders FA011, FA012, and FA013, an AND gate, a NAND gate, and an OR gate. When an up signal up014 is supplied, the counter is incremented. When a down signal dw014 is supplied, the counter is decremented and 4-bit output signals cnt014, cnt015, cnt016, and cnt017 are outputted. By feeding back the output signals to the inside, the counting is limited. An asynchronous up-down counter can be constructed with the configuration.

Figure 32:
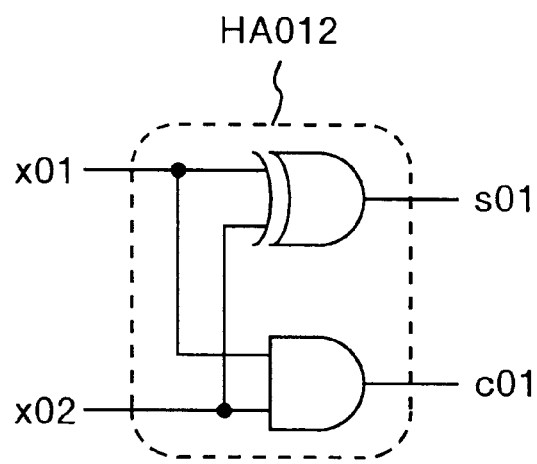
FIG. 32 is a circuit diagram of a half adder.
Figure 33:
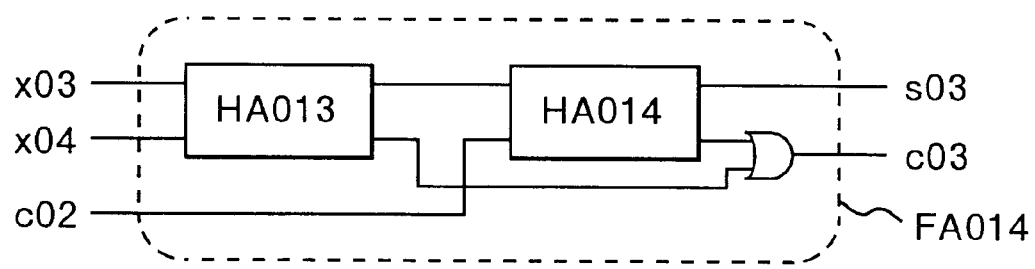
FIG. 33 is a circuit diagram of a full adder.

A half adder HA012 can be constructed as shown in FIG. 32. A fall adder FA014 can be constructed by combining half adders HA013 and HA014, as shown in FIG. 33.

Figure 34:
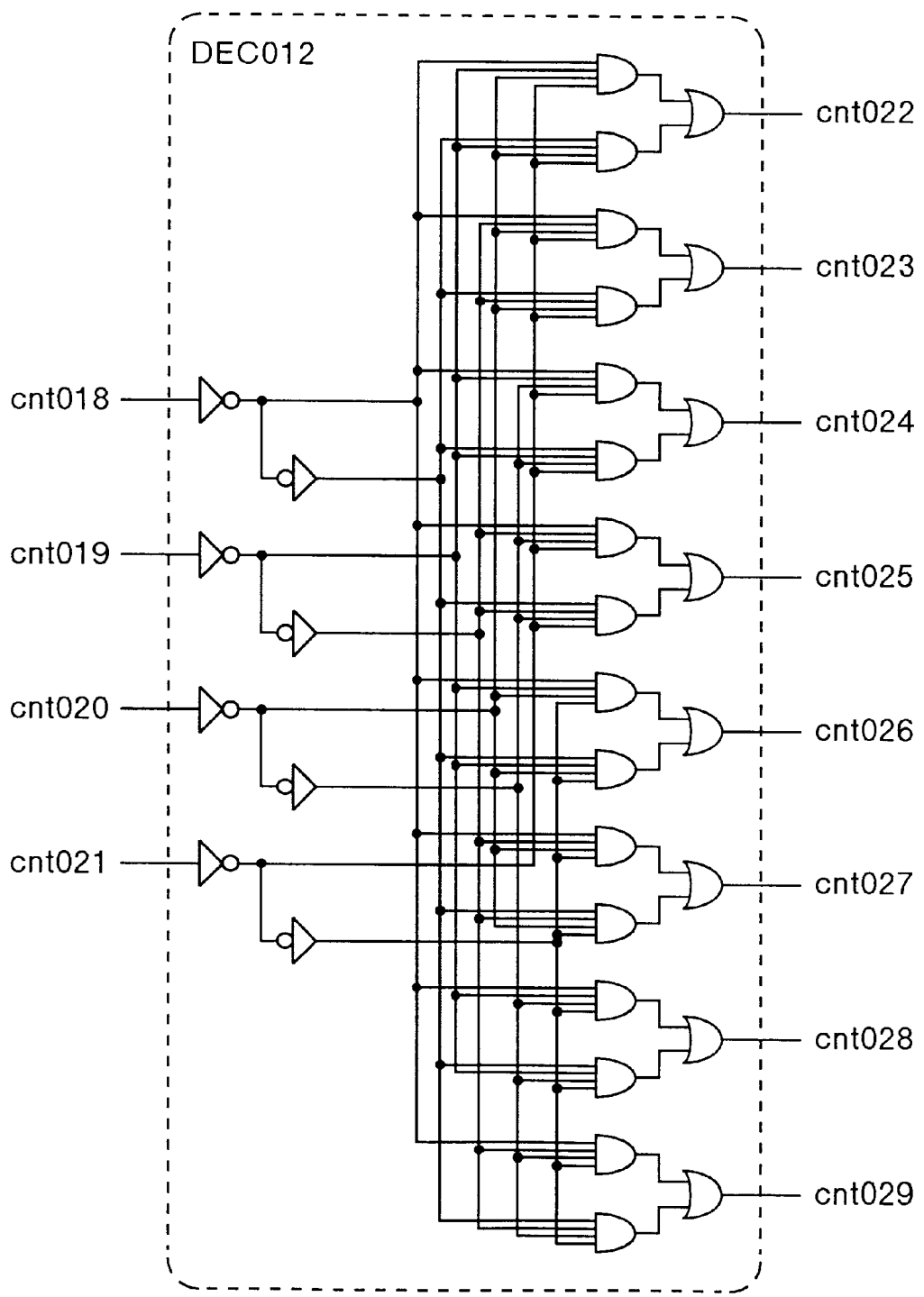
FIG. 34 is a circuit diagram of a decoder.

A decoder can be constructed as shown in FIG. 34. In this case, a 4-bit input signal cnt0-18–021 is converted into an 8-bit output signal cnt022–029.

Figure 35:
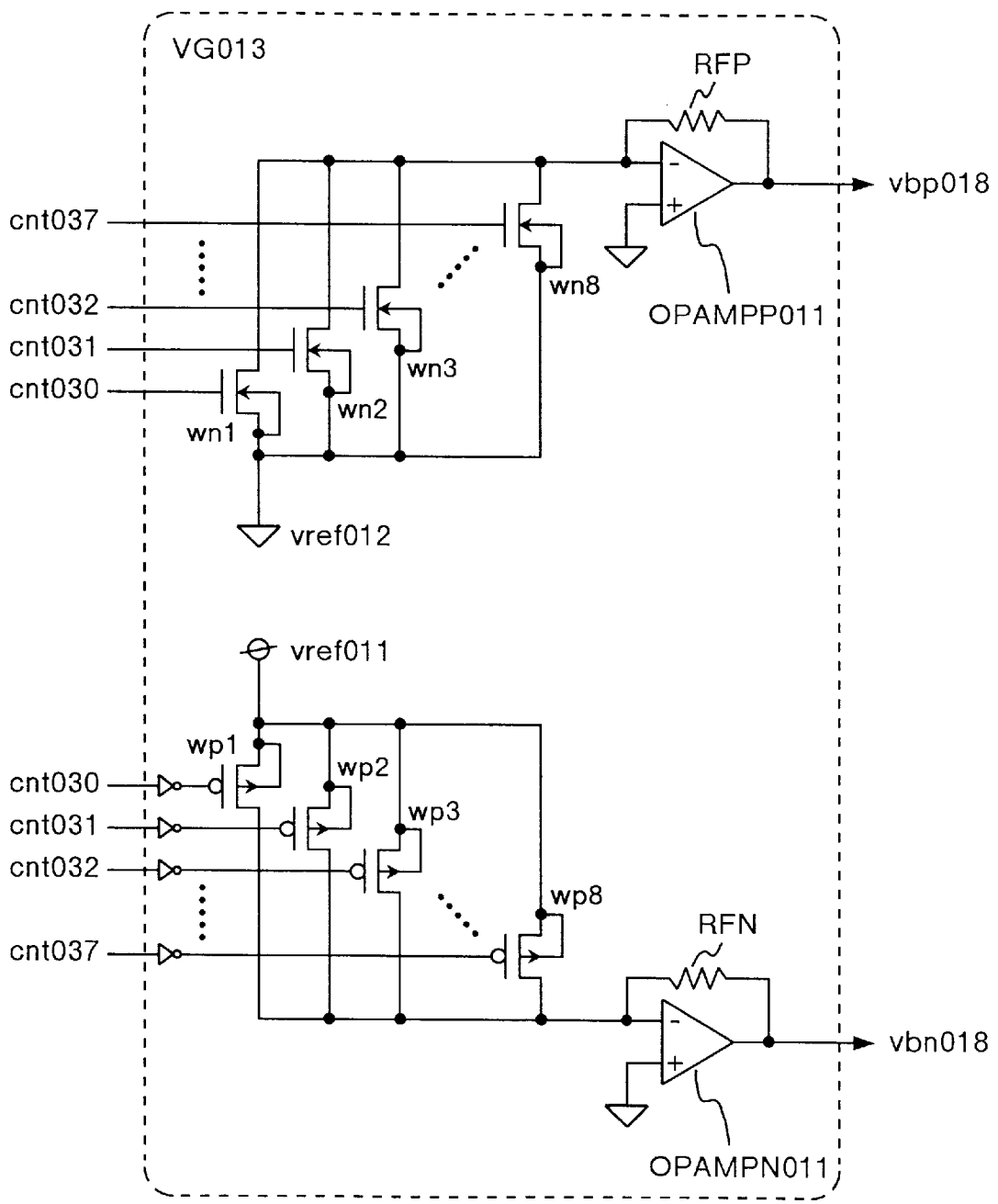
FIG. 35 is a diagram of a voltage generator.

FIG. 35 shows an embodiment of a voltage generator. Besides the digital-to-analog converter shown in FIG. 19, a voltage generator VG013 can be also constructed as illustrated in FIG. 35. An output voltage is changed by control signals cnt030 to cnt037 for input. Operating amplifier OPAMPP011 and OPAMPN011 and resistors RFP and RFN can be connected to the output part in order to decrease output impedance. Outputs of the voltage generator VG013 become substrate bias signals vbp018 and vbn018.

Figure 36:
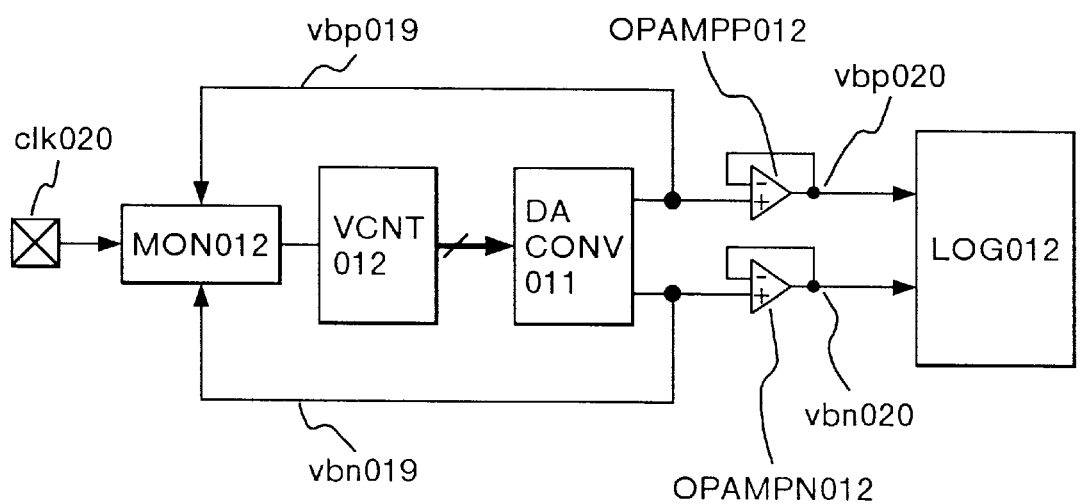
FIG. 36 is a diagram showing the configuration of another embodiment of the invention.

FIG. 36 is a diagram showing another embodiment of the invention. A delay detector MON012 receives a clock signal clk020 and outputs a delay signal. A voltage-controlled circuit VCNT012 generates a control signal on the basis of the delay signal and transmits it to a digital-to-analog converter DACONV011. The digital-to-analog converter DACONV011 generates substrate bias signals vbp019 and vbn019 in accordance with the control signal and applies them to the delay detector MON012. Operating amplifiers OPAMPP012 and OPAMPN012 receive the substrate bias signals, output substrate bias signals vbp020 and vbn020 at the same voltages as vbp and vbn, and apply them to the substrate of a main circuit LOG012. The delay detector MON012 can change a signal transmission delay by the substrate biases vbp019 and vbn019, and the voltage-controlled circuit VCNT012 generates a control signal so that the digital-to-analog converter generates a substrate bias signal which makes the delay of the output signal of the delay detector MON012 always constant. Consequently, the operation speed of both the delay detector MON012 and the main circuit LOG012 becomes always constant. When the circuit scale of the main circuit LOG012 is large, it takes time until the substrate bias signals vbp020 and vbn202 become stable. By inserting circuits of a low output impedance such as the operating amplifiers OPAMPP012 and OPAMPN012, it hastens the stabilization of the substrate bias signal. The operating amplifiers may be also inserted for the substrate biases vbp019 and vbn019 for the delay monitoring circuit MON012.

Figure 37:
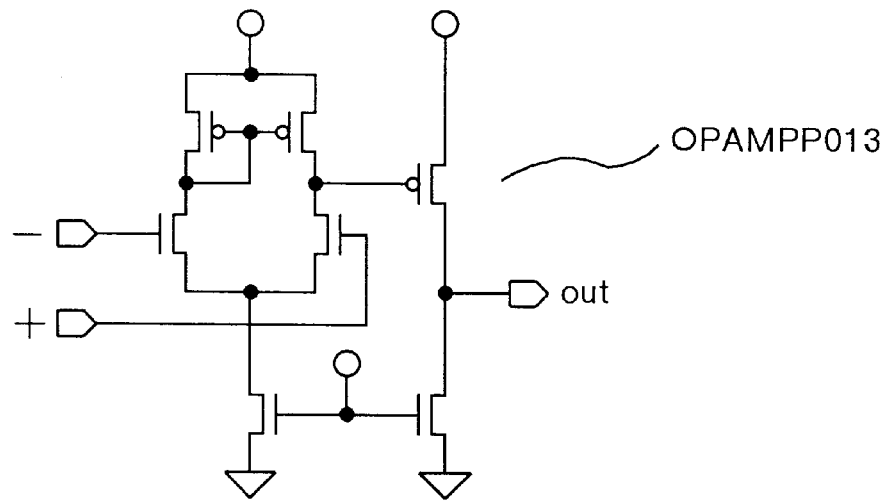
FIG. 37 is a diagram of an operating amplifier.
Figure 38:
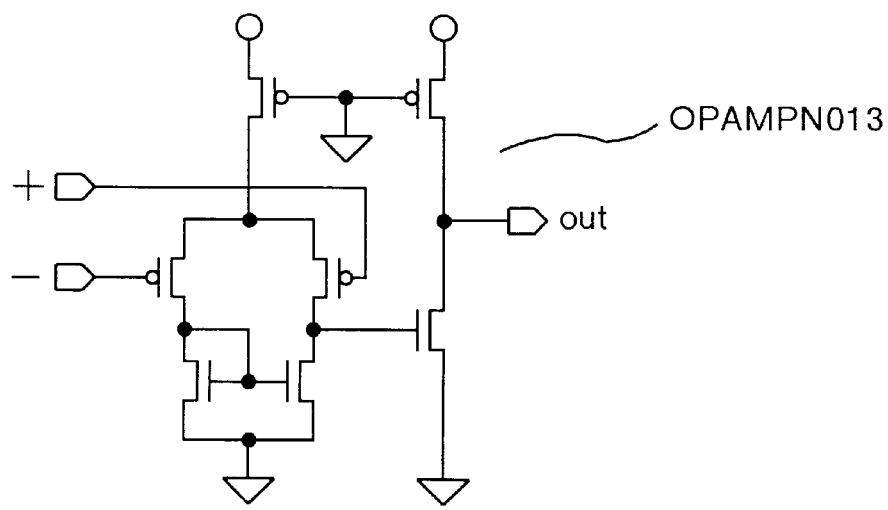
FIG. 38 is a diagram of an operating amplifier.

FIGS. 37 and 38 show embodiments of the operating amplifier.

Figure 39:
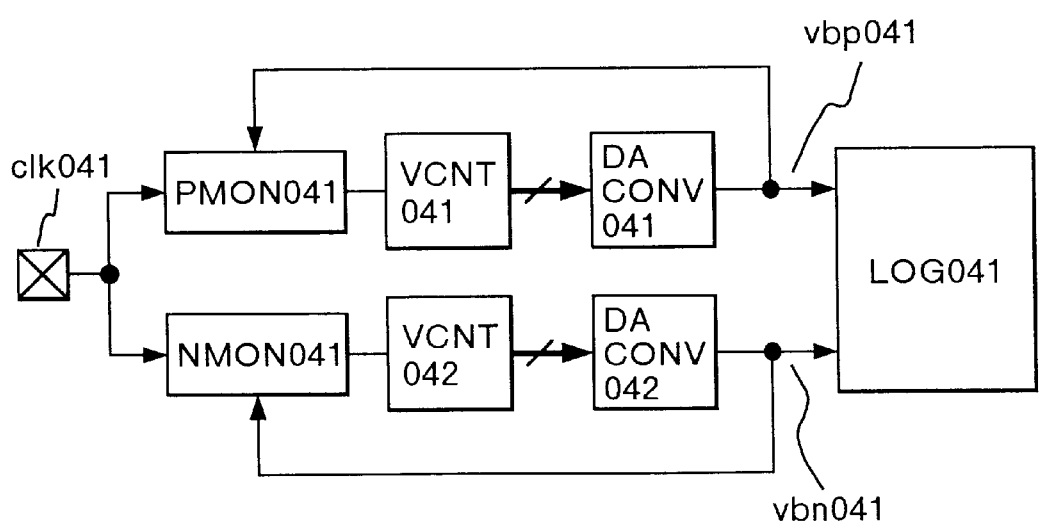
FIG. 39 is a diagram showing the configuration of another embodiment of the invention.

FIG. 39 is a diagram showing another embodiment of the invention. A delay detector PMON041 for a pMOS transistor can change delay by a substrate bias signal vbp041 for a PMOS transistor. A delay detector NMON041 for an nMOS transistor can change delay by a substrate bias signal vbn041 for an nMOS transistor. The delay detectors PMON041 and NMON041 receive a clock signal clk041 and transmit a delayed signal to voltage-controlled circuits VCNT041 and VCNT042, respectively. Each of the voltage-controlled circuits VCNT041 and VCNT042 outputs a control signal according to the delay signal. Digital-to-analog converters DACONV041 and DACONV042 generate a substrate bias vbp041 for a pMOS transistor and a substrate bias vbn041 for an nMOS transistor in accordance with the respective control signals, and supply them to the delay detectors PMON041 and NMON041, respectively, and to the main circuit LOG041. The digital-to-analog converter DACONV041 eliminates a change in delay caused by a pMOS transistor, and the digital-to-analog converter DACONV042 eliminates a change in delay caused by an nMOS transistor, thereby keeping constant the operating speeds of the main circuit LOG041 and the delay detectors PMON041 and NMON041. By independently controlling the change in delay of the pMOS transistor and the change in delay of the nMOS transistor, the very accurate substrate bias control can be realized.

Figure 40:
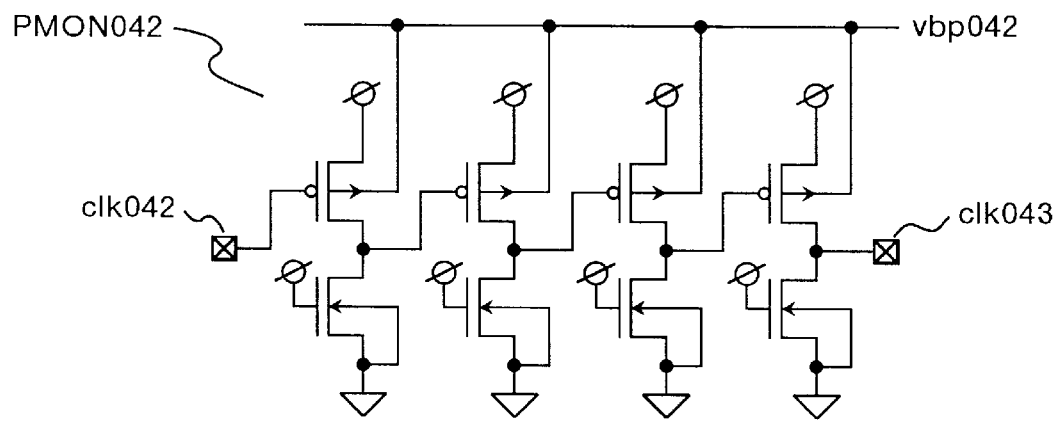
FIG. 40 is a diagram of a delay detector.
Figure 41:
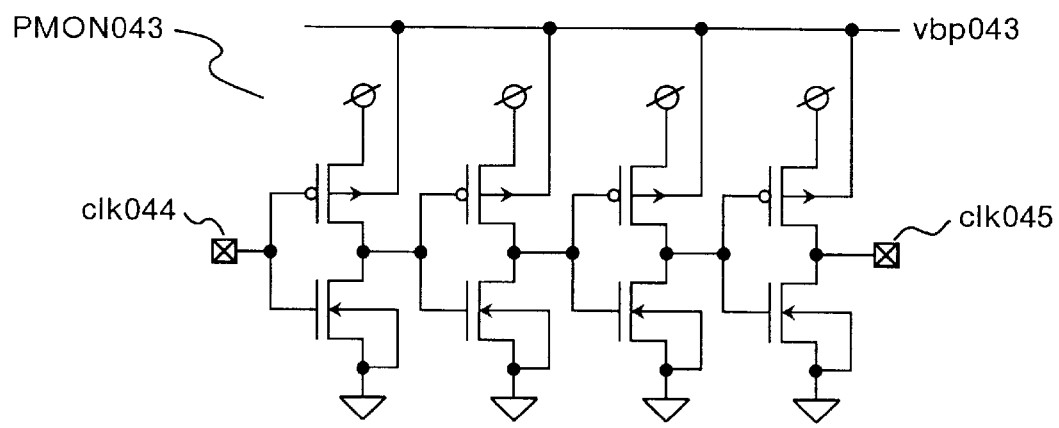
FIG. 41 is a diagram of a delay detector.

FIGS. 40 and 41 show delay detectors for pMOS transistors. With the configurations shown in the diagrams, substrate biases vbp042 and vbp043 for pMOS transistors are supplied, thereby enabling a change in delay to be controlled.

Figure 42:
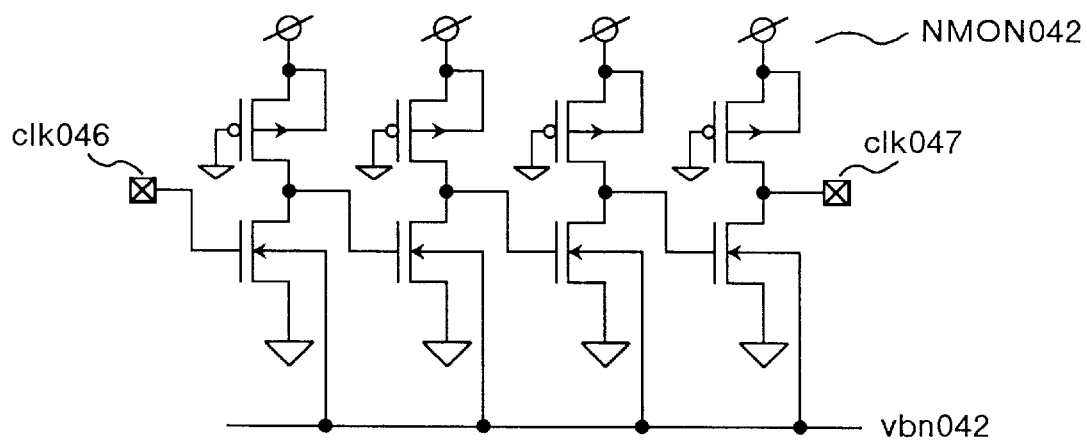
FIG. 42 is a diagram of a delay detector.
Figure 43:
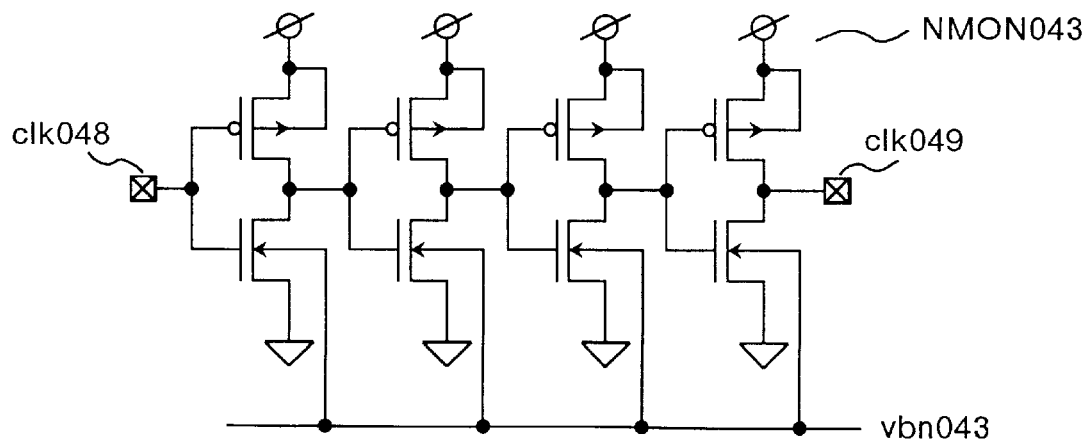
FIG. 43 is a diagram of a delay detector.

FIGS. 42 and 43 show delay detectors for nMOS transistors. Similarly, substrate biases vbn042 and vbn043 for nMOS transistors are supplied, thereby enabling a change in delay to be controlled.

Figure 44:
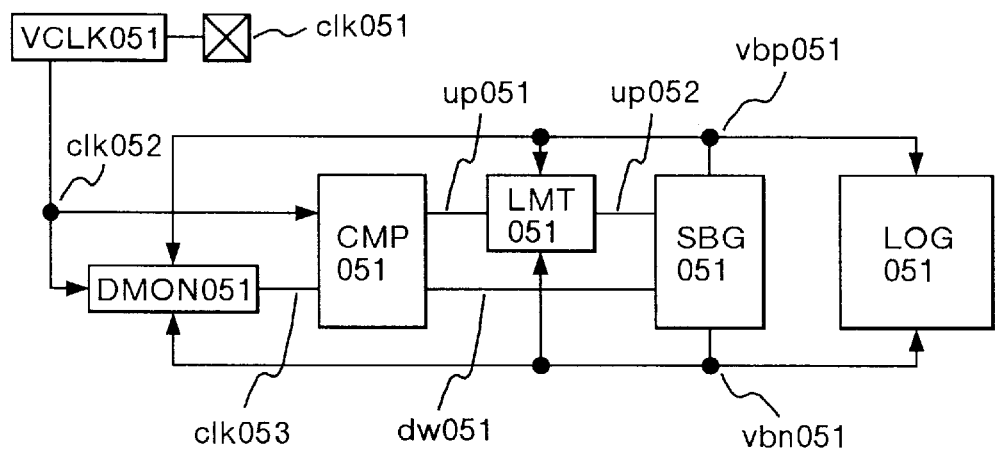
FIG. 44 is a diagram showing the configuration of another embodiment of the invention.

FIG. 44 is a diagram showing another embodiment of the invention, which comprises the delay controller according to the embodiment of FIG. 2 and a leakage-current detector LMT051. The leakage-current detector receives substrate biases vbp051 and vbn051, generated by a substrate bias generator SBG051, and detects a leakage current of the circuit. When the leakage current increases to a predetermined value or more, the substrate bias control is stopped so that the substrate bias does not change. The leakage-current detector LMT051 therefore limits the increase in the leakage current by the substrate bias control, thereby preventing an erroneous operation caused by an operating error in high temperature or the like.

Figure 45:
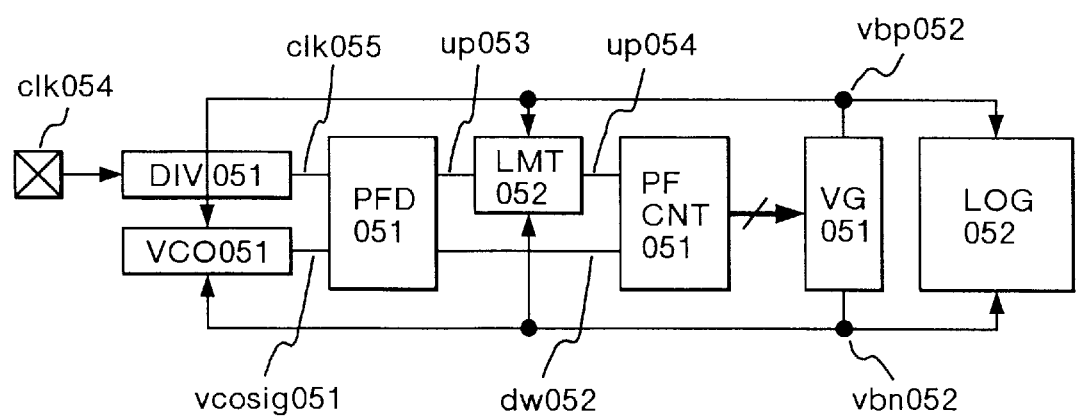
FIG. 45 is a diagram showing the configuration of another embodiment of the invention.

FIG. 45 is a diagram showing another embodiment of the invention, which comprises the delay controller in the embodiment of FIG. 22 and a leakage-current detector LMT052. The leakage-current detector receives substrate biases vbp052 and vbn052, generated by a voltage generator VG051, and detects a leakage current of the circuit. When the leakage current increases to a predetermined value or more, the substrate bias control is stopped so that the substrate bias does not change. The leakage-current detector LMT052 therefore limits the increase in the leakage current by the substrate bias control, thereby preventing an erroneous operation caused by an operating error in high temperature or the like.

Figure 46:
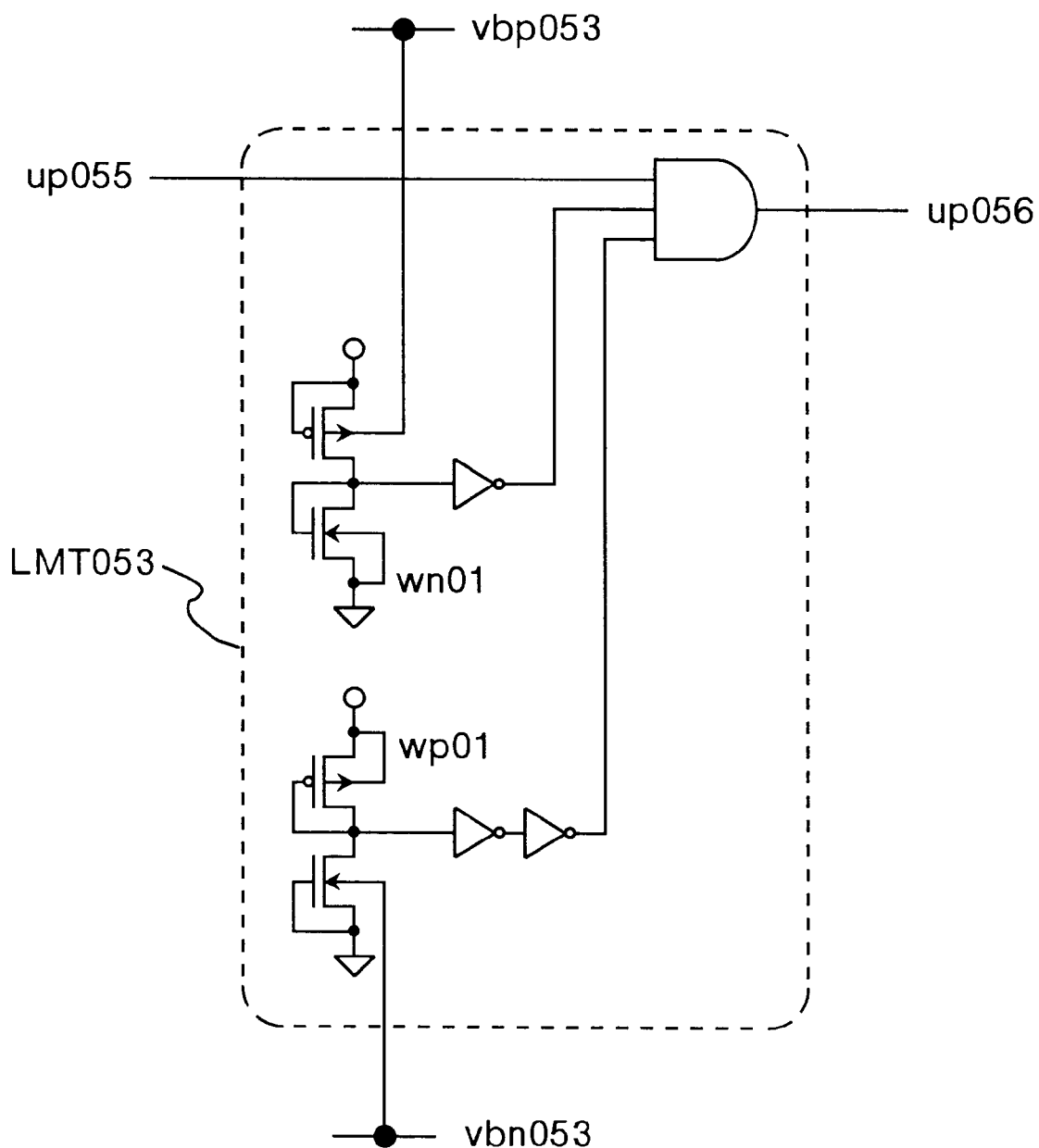
FIG. 46 is a diagram of a leakage-current detector.

FIG. 46 is a diagram showing an embodiment of the leakage current detector, which is inserted between up signals up055 and up056 in the direction of increasing a leakage current by the substrate bias control. The limit value of the leakage current by the substrate bias vbp053 for a pMOS transistor is determined by a diffusion-layer width wn01 of an nMOS transistor. The limit value of the leakage current by the substrate bias vbn053 for an nMOS transistor is determined by a diffusion-layer width wp01 of a pMOS transistor.

Figure 47A:
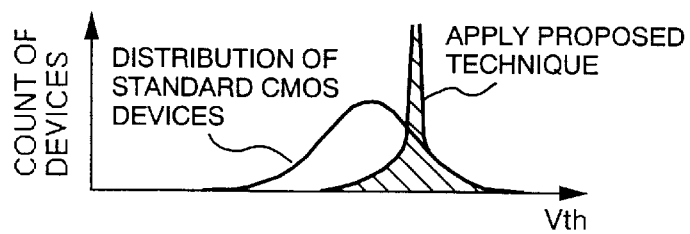
FIGS. 47a and 47b are diagrams showing effects of the invention.
Figure 47B:
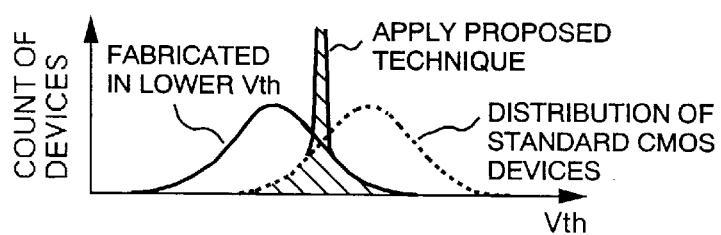

FIG. 47 is a diagram showing a method of applying the proposed technique. A standard CMOS device has distribution of performance as shown in FIG. 47(a) by the factors such as fabrication process, operating voltage, and operating temperature. The threshold upper limit of the distribution is determined by the lower-bound of delay and the lower limit is determined by the upper-bound of power consumption. When the proposed technique is applied to such a device, the spread of the performance distribution can be narrowed, as shown by the hatched part. In the case of applying the substrate bias only in the reverse bias direction, with respect to the control by the substrate bias, the distribution is shifted to the side where the threshold is high and the operation speed is slow. When the device is fabricated preliminarily with a lower threshold, as shown in FIG. 47(b), the lower limit of the distribution exceeds the limit of power consumption. When the proposed technique is applied to the device, however, the distribution shown by the hatched part can be obtained. The distribution of the device can be set in an area where the threshold is low and the operation speed is high without exceeding the limit of power consumption, so that the high-processing speed of the circuit can be realized.

Figure 48:
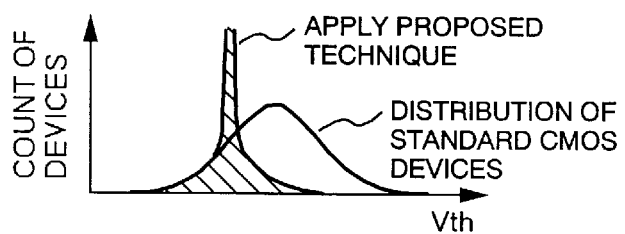
FIG. 48 is a diagram showing effects of the invention.
Figure 50:
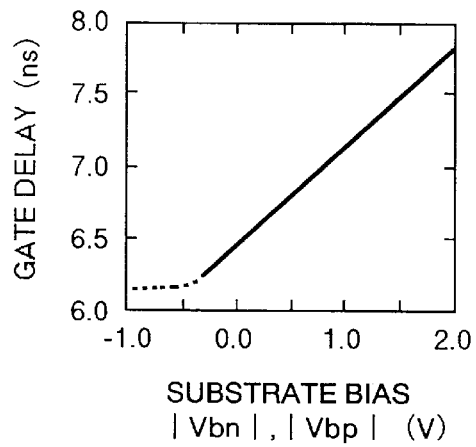
FIG. 50 is a diagram showing the relation between substrate bias and gate delay.

FIG. 48 is a diagram showing another method of applying the proposed technique. As shown in FIG. 50, the substrate bias of up to about 0.5V can be applied in the forward bias direction to operate a device. When the proposed technique is applied by performing the forward bias control, as shown in FIG. 48, the distribution of a standard CMOS device can be converged to the hatched position, in which the threshold is low and the operation is high. Thus, the high-processing speed of the circuit can be realized.

Figure 49:
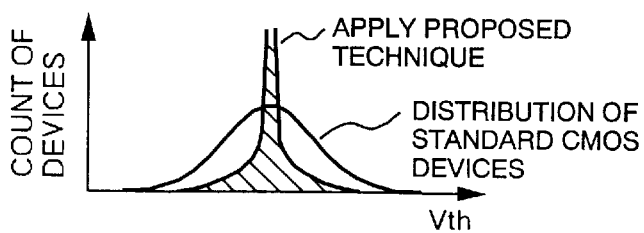
FIG. 49 is a diagram showing effects of the invention.

FIG. 49 is a diagram showing another method of applying the proposed technique. When the substrate bias control in both the reverse bias direction and the forward-bias direction are used, the distribution of the device can be set to the design center value, as shown by the hatched distribution. The yield of the device can therefore be therefore.

Figure 51:
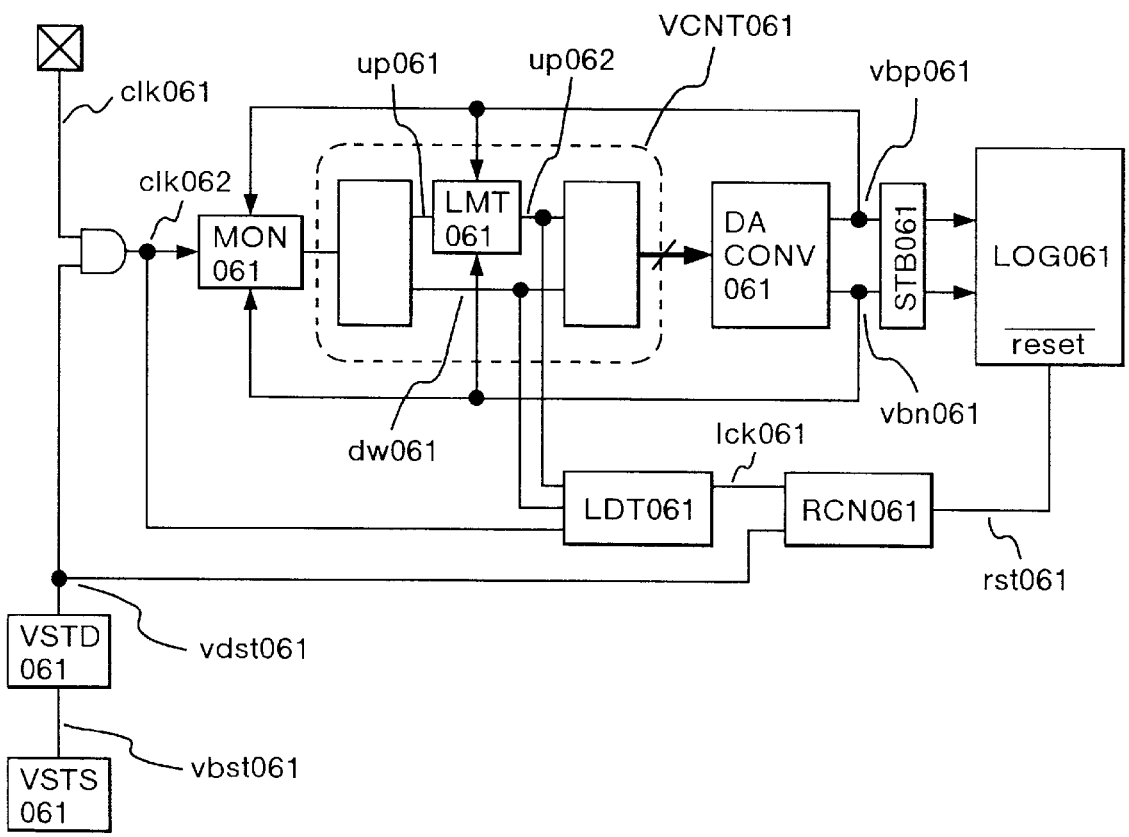
FIG. 51 is a diagram showing the configuration of another embodiment of the invention.

FIG. 51 is a diagram showing another embodiment of the invention, which comprises the delay controller according to the embodiment of FIG. 44 or 45, a substrate-bias stable-state detector VSTS061, a supply-voltage stable-state detector VSTD061, a lock detector LDT061, a reset cancellation circuit RCN061, and a standby circuit STB061. By the embodiment, the operation procedure of the semiconductor integrated circuit according to the invention, is determined. When the power switch is turned on, the substrate bias is supplied, and the substrate-bias stable-state detector VSTS061 determines the stable state of the substrate bias potential and generates a substrate-bias stable-state signal vbst061. Upon receipt of the substrate-bias stable-state signal vbst061, the supply-voltage stable-state detector VSTD061 supplies a voltage, determines the stable state of the supply voltage, and generates a supply-voltage stable-state signal vdst061. By this procedure, the substrate bias is always supplied before the supply voltage, thereby enabling prevention of latch-up of the MOS transistor. When the supply-voltage stable-state signal vdst061 is supplied, a clock signal clk061 starts to be transmitted to the controller. The lock detector LDT061 receives a clock signal clk062 supplied to the controller, an up signal up062 and a down signal dw061 which are in the controller. When the control signal in the controller becomes stable, the lock detector LDT061 outputs a lock signal lck061. The reset cancellation circuit RCN061 receives the lock signal lck061 and the supply-voltage stable-state signal, vdst061 and outputs a reset cancellation signal rst061. The main circuit LOG061 cancels the reset state by receiving the reset cancellation signal rst061 and starts operating. By the procedure, an erroneous operation of the main circuit LOG061 is prevented.

Figure 56:
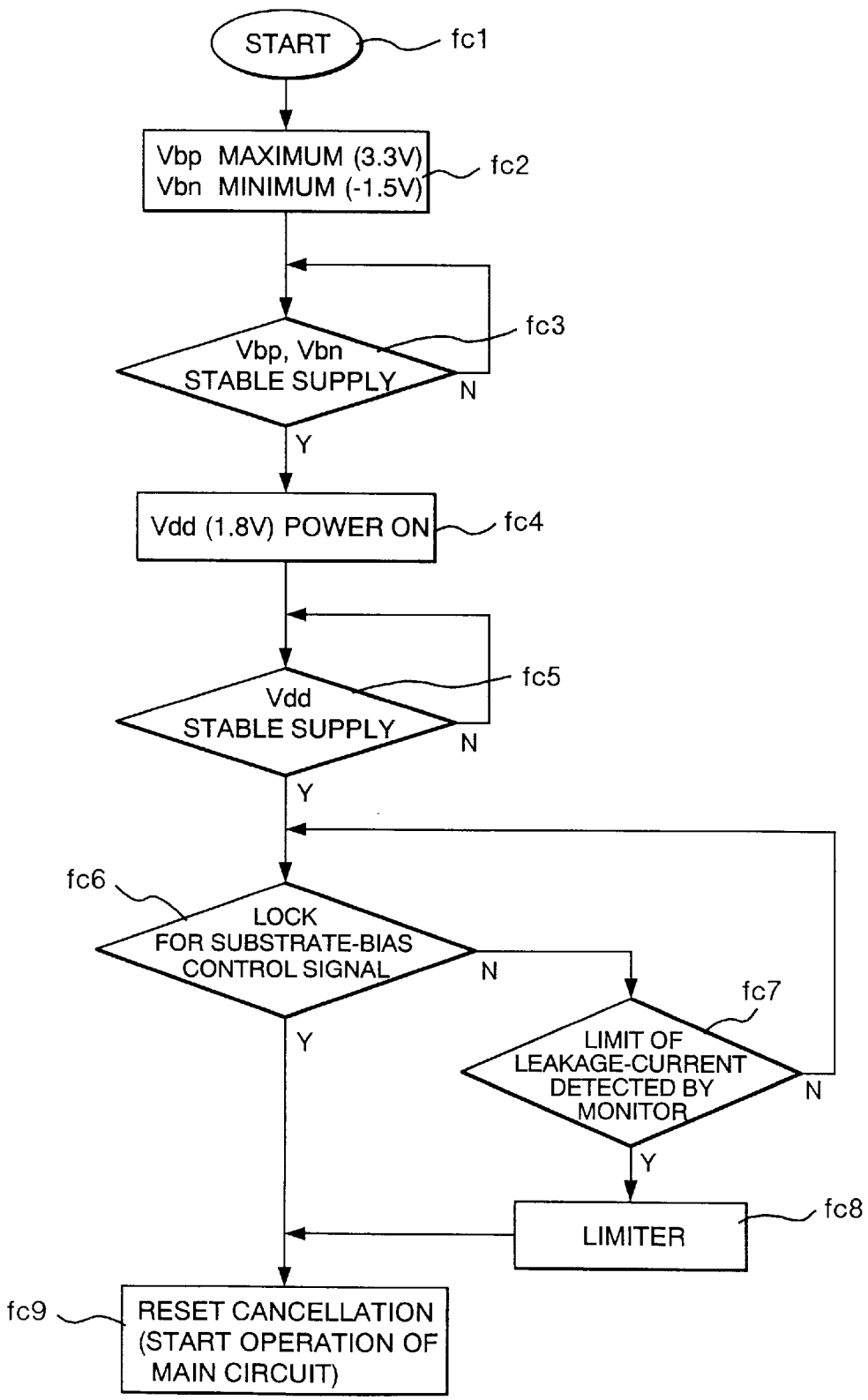
FIG. 56 is a diagram showing an operating procedure of the invention.
Figure 57:
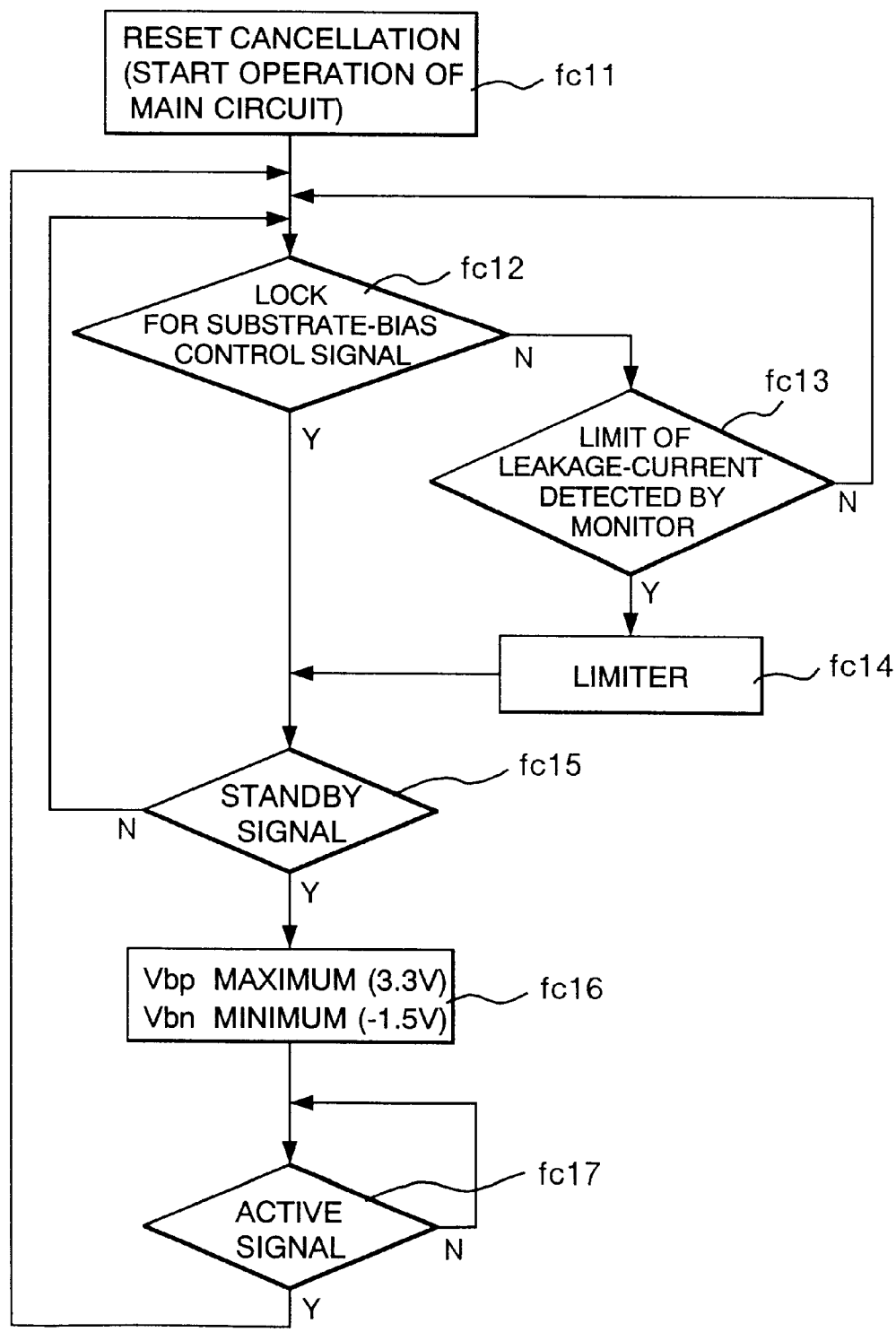
FIG. 57 is a diagram showing an operating procedure of the invention.

The operation procedure of the invention according to the embodiment is shown in FIGS. 56 and 57.

FIG. 56 is a diagram showing the processing procedure from the start of the system until the start of the operation of the main circuit. Such a procedure can be made by a program or made as a wired ROM.

After the start of the system in process fc1, the maximum voltage is applied as a pMOS substrate bias Vbp and the minimum voltage is applied as an nMOS substrate bias Vbn as shown in process fc2. In process fc3, whether the substrate bias is stable or not is determined. The system waits until the substrate bias becomes stable. After obtaining the stable state, the program moves to process fc4. After the substrate bias is stabilized, a supply voltage is supplied in process fc4. In process fc5, whether the supply voltage is stable or not is determined. The system waits until the supply voltage becomes stable. After obtaining the stable state, the program moves to process fc6. In process fc6, the substrate bias control is started, and whether the control signal is locked or not is determined. When the control signal is not locked, a leakage current monitor checks whether the leakage current exceeds the limit or not in process fc7. When NO, the program continues process fc6. When the leakage current exceeds the limit in process fc7, a limiter of the leakage current operates in process fc8, so that the substrate bias control signal does not change any more, and the program progresses to process fc9. When the substrate bias control signal is locked within the limit of the leakage current, the program shifts from process fc6 to process fc9. In process fc9, the reset is cancelled and the operation of the main circuit is started. By this operating procedure, the latch-up of the MOS transistor at the operation start time and an erroneous operation of the circuit, caused by the operating error in high temperature or the like, can be prevented.

FIG. 57 is a diagram showing a procedure of preventing an erroneous operation caused by an operating error in high temperature or the like during the operation of the main circuit. The reset is cancelled and the operation of the main circuit is started in process fc11. After that, it is confirmed in process fc12 that the substrate bias control signal is always locked. When it is locked, whether a standby signal is generated or not is determined in process fc15. When the standby signal is not generated, the program returns to process fc12. When the substrate bias signal is unlocked in process fc12, the leakage current monitor determined the limit of the leakage current in process fc13. When the leakage current does not exceed the limit, the program returns to process fc12. When the leakage current exceeds the limit, the limiter is operated in process fc14 to stop a change in the substrate bias control signal, and the program progresses to process fc15. When a standby signal is generated in process fc15, the pMOS substrate bias Vbp is increased to the maximum value and the nMOS substrate bias is decreased to the minimum value in process fc16, thereby reducing the power consumption by the leakage current in the standby state.

In process fc17, generation of an active signal is detected. Until it is generated, the standby state is maintained. When the active signal is generated, the standby state is cancelled to thereby restart the operation of the main circuit, and the program returns to process fc12.

Figure 52:
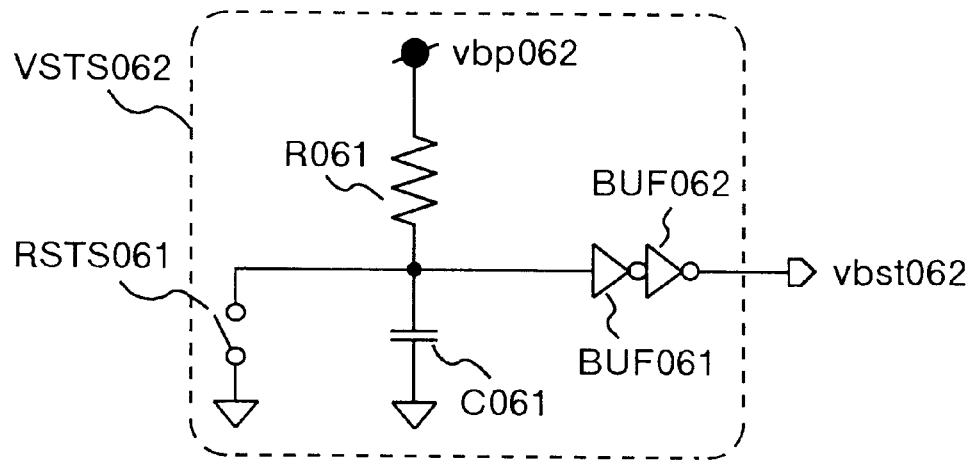
FIG. 52 is a diagram of a substrate-bias stable-state detector.

FIG. 52 is a diagram showing an embodiment of the substrate-bias stable-state detector. When a reset switch RSTS061 is cancelled, the substrate bias voltage is charged in a capacitor C061 through a resistor R061. Vbp062 denotes a power source. When the charged voltage exceeds a predetermined value, buffer circuits BUF061 and BUF062 operate, and a substrate-bias stable-state signal vbst062 is generated.

Figure 53:
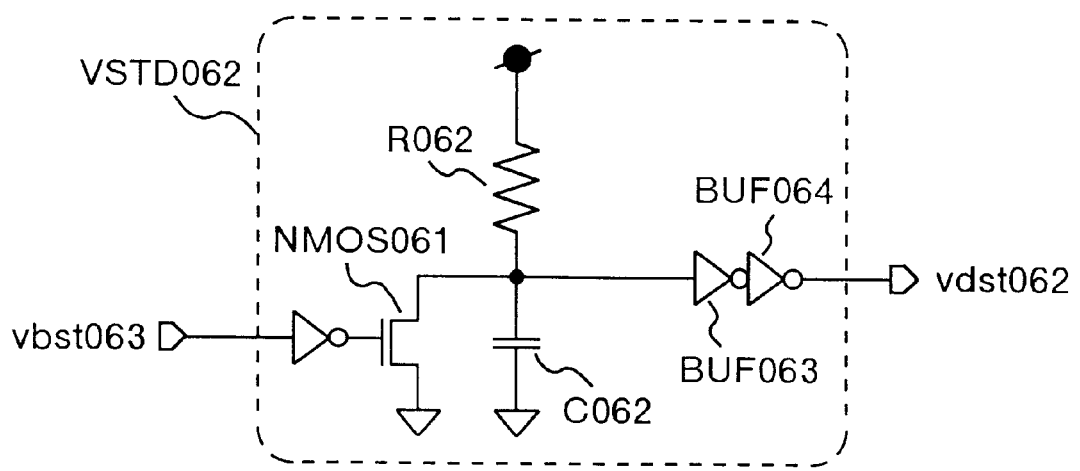
FIG. 53 is a diagram of a supply-voltage stable-state detector.

FIG. 53 is a diagram showing an embodiment of the supply-voltage stable-state detector. When a substrate-bias stable-state signal vbst063 is received, an n-type MOS transistor is turned off and the supply voltage is charged in a capacitor C062 through a resistor R062. When the charged voltage exceeds a predetermined value, buffer circuits BUF063 and BUG064 operate, and a powersupply stable-state signal vdst062 is generated.

Figure 54:
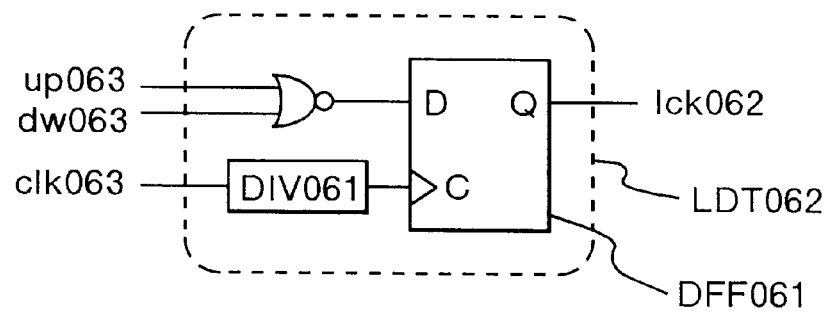
FIG. 54 is a diagram of a lock detector.

FIG. 54 is a diagram showing an embodiment of the lock detector. The frequency of a clock signal clk063 is divided by a divider DIV061, and a resultant signal is supplied as a clock signal to a D-type flip flop DFF061. The NOR of an up signal up063 and a down signal dw063 is obtained and is supplied as a data signal to DFF061. When both the up signal and the down signal are not generated, a lock signal lck062 is generated.

Figure 55:
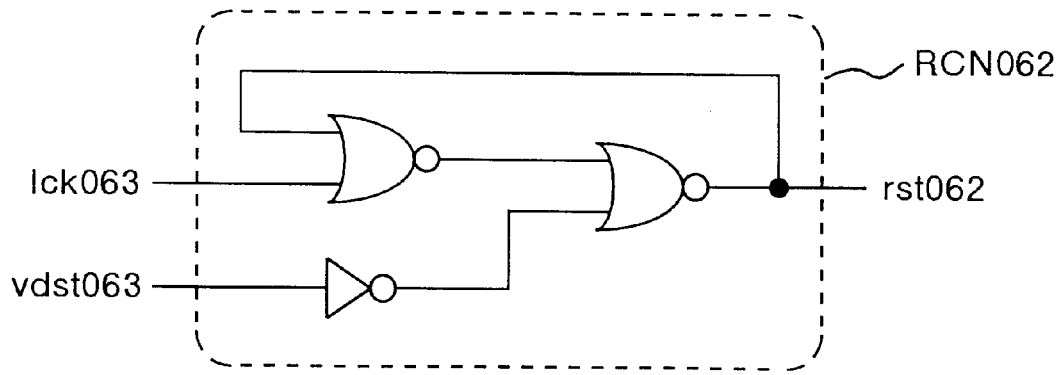
FIG. 55 is a diagram of a reset cancellation circuit.

FIG. 55 is a diagram showing an embodiment of the reset cancellation circuit. A reset cancellation circuit RCN062 receives a lock signal lck063 and a supply-voltage stable-state signal vdst063, and generates a reset cancellation signal rst062. In the state where no input signal is supplied before the start of the operation of the system and the state where only the supply-voltage stable-state signal vdst063 is generated, the reset cancellation signal rst062 is at the low level to maintain the reset state. After that, when the lock signal lck063 is generated, rst062 goes high and the reset is cancelled. Once the reset is cancelled, the reset cancellation signal rst062 maintains at the high level and is not reset until the system is stopped.

Figure 58:
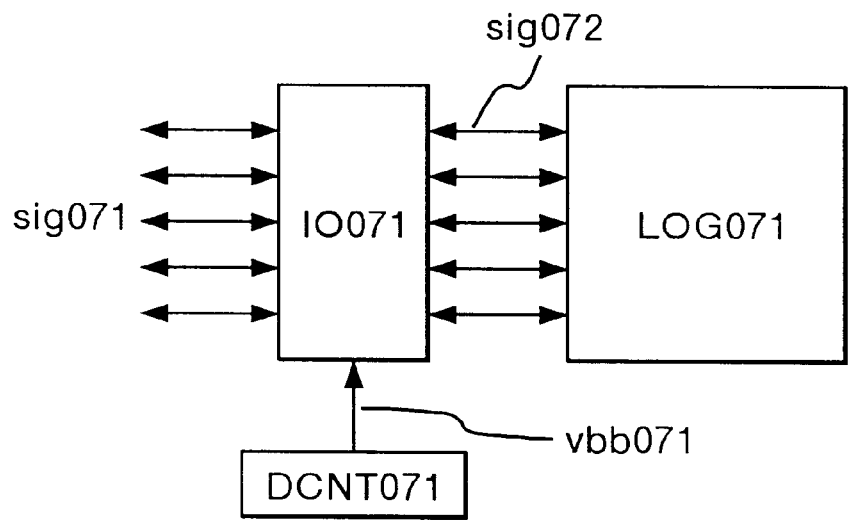
FIG. 58 is a diagram showing the configuration of another embodiment of the invention.

FIG. 58 is a diagram showing another embodiment of the invention. By adjusting the operating speed of an input/output circuit IO071 by using a substrate bias signal vbb071 for speed control outputted from a speed controller DCNT071, the signal transmitting speed of both an input/output signal sig071 from the outside to the input/output circuit IO071, and a signal sig072 from the input/output circuit IO071 to a main circuit LOG071, is controlled. The signal transmitting speed of the signal to the input/output circuit IO071 may vary according to the voltage. By keeping the speed at the rising edge and the speed at the trailing edge in the signal transition of IO071 at a constant value, the speed variation can be eliminated.

Another feature of the embodiment is that the operating speed of the input/output circuit can be controlled independent of the main circuit.

When the operating speed of an external circuit is slow, it is irrelevant that the input/output circuit operates at a faster rate. The substrate bias of the input/output circuit is controlled separately from the main circuit. The threshold of a transistor constructing this part is set to be high, and the power consumption by the leakage current can be reduced instead of regulating the operating speed.

Figure 59:
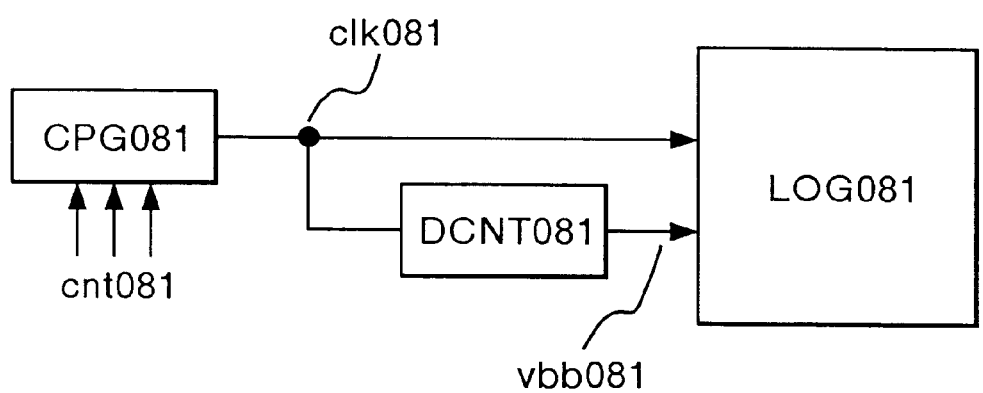
FIG. 59 is a diagram showing the configuration of another embodiment of the invention.
Figure 60:
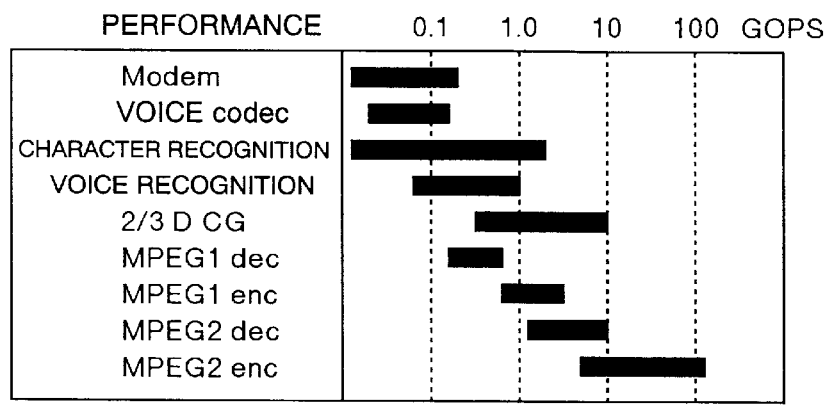
FIG. 60 is a diagram showing the relation between examples of applying the invention and required performances.

FIG. 59 is a diagram showing another embodiment of the invention. A clock generator CPG081 can vary the frequency of a clock signal clk081 in accordance with a control signal cnt081. A speed controller DCNT081 generates a substrate bias control signal vbb081 according to the frequency of the clock signal clk081 and supplies it to a main circuit LOG081. Consequently, the main circuit LOG081, can operate at an optimum speed for a change in the clock signal clk081 generated by the clock generator CPG081. In a signal process performed by the main circuit LOG081, the processing speed and performance required vary according to the purpose of use, as shown in FIG. 60. By changing the operating speed in accordance with the purpose of use, the power consumption can be reduced.

Figure 61:
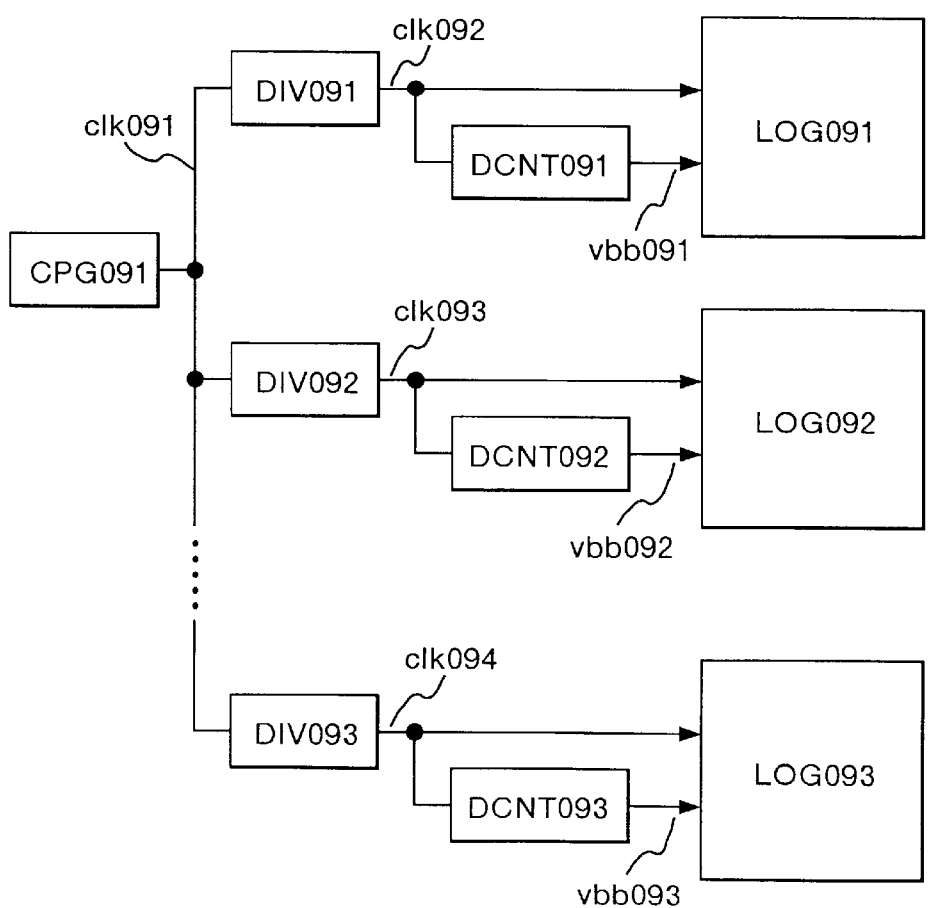
FIG. 61 is a diagram showing the configuration of another embodiment of the invention.

FIG. 61 is a diagram showing another embodiment of the invention. The frequency of a clock signal clk091 generated by a clock generator CPG091 is divided by dividers DIV091, DIV092, DIV093, and the like, thereby generating clock signals clk092, clk093, and clk094 of different frequencies. Speed controllers DCNT091, DCNT092, and DCNT093 receive the clock signals clk092, clk093, and clk094, and generate optimum substrate bias signals vbb091, vbb092, and vbb093 according to the respective clock frequencies to control the operating speeds of main circuits LOG091, LOG092, and LOG093. Thus, in one system, blocks pertaining to related processes can operate at different processing speeds.

Figure 65:
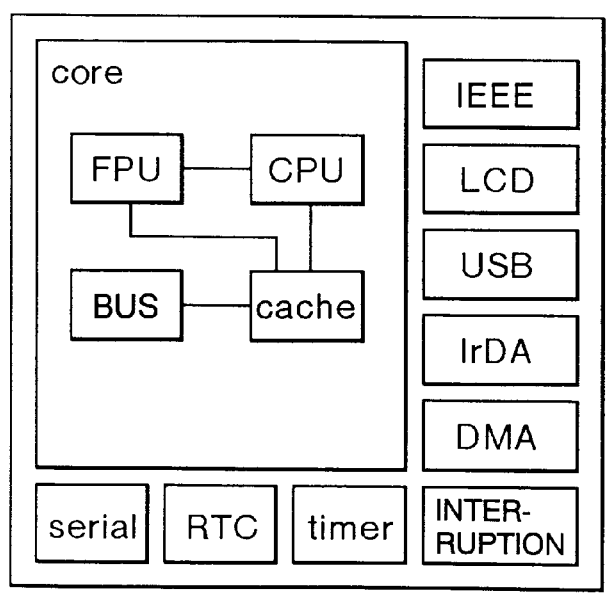
FIG. 65 is a diagram illustrating an example of the configuration of a microprocessor.

FIG. 65 shows an embodiment of divided blocks in a system. For example, the processing speed of a block of a liquid-crystal display controller LCD can be varied according to the resolution of a liquid-crystal display. By properly adjusting the operating state (active state) or the non-operating state (standby state) of each block, the power consumption can be reduced.

Figure 62:
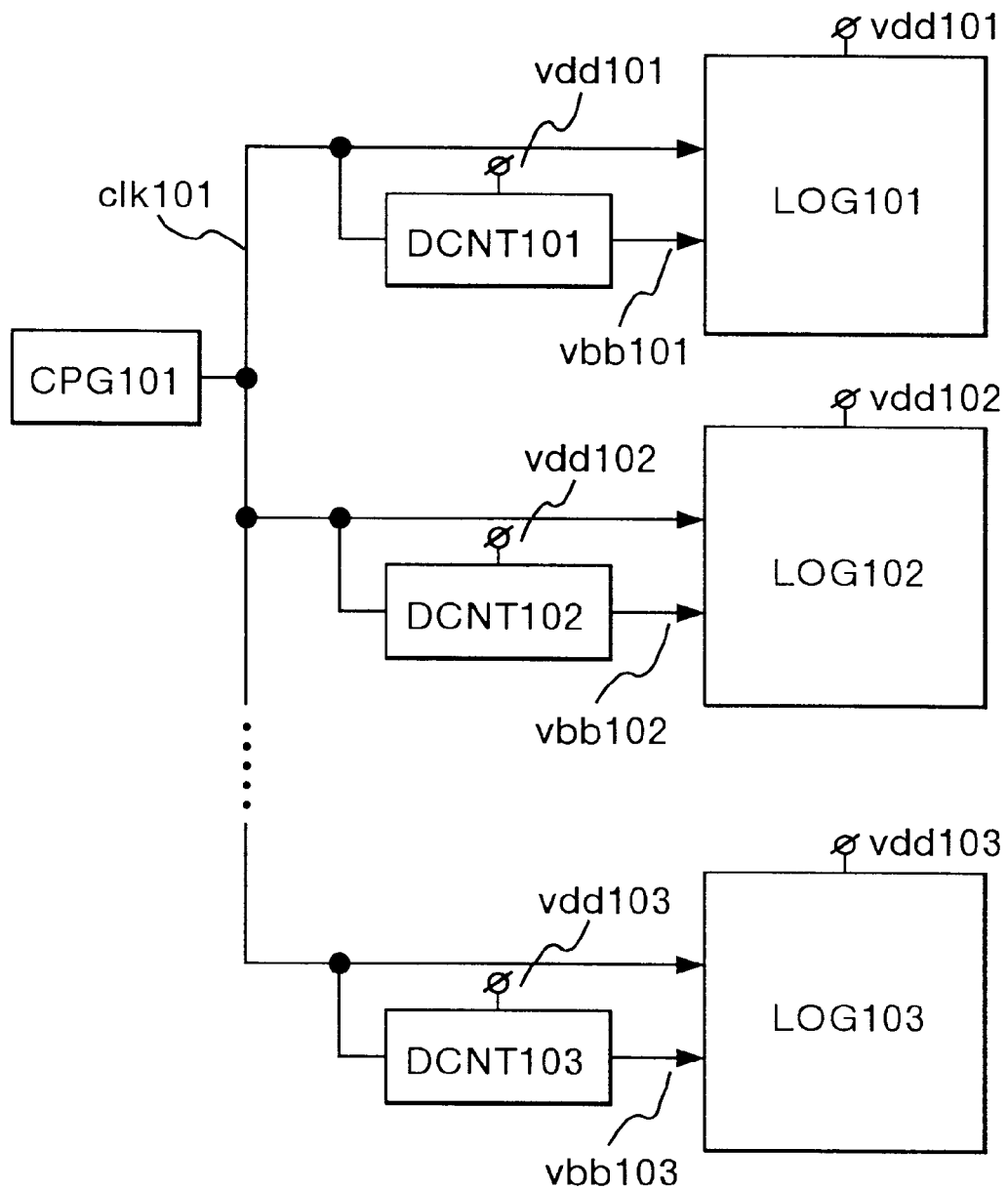
FIG. 62 is a diagram showing the configuration of another embodiment of the invention.

FIG. 62 is a diagram showing another embodiment of the invention. Speed controllers DCNT101, DCNT102, and DCNT103 which receive a clock signal clk101 of a clock generator CPG101, generate substrate-bias signals vbb101, vbb102, and vbb103 in accordance with supply voltages vdd101, vdd102, and vdd103 and apply them to main circuits LOG101, LOG102, and LOG103, respectively. Since the supply voltages vdd101, vdd102, and vdd103 which are different from each other, are applied, the main circuits LOG101, LOG102, and LOG103 can operate by receiving substrate biases which are optimum to the respective operating speeds. In the case of applying different supply voltages to blocks, each for related processes within one system, the optimum substrate bias control can be performed to each of the main circuits constructing the blocks.

Figure 63:
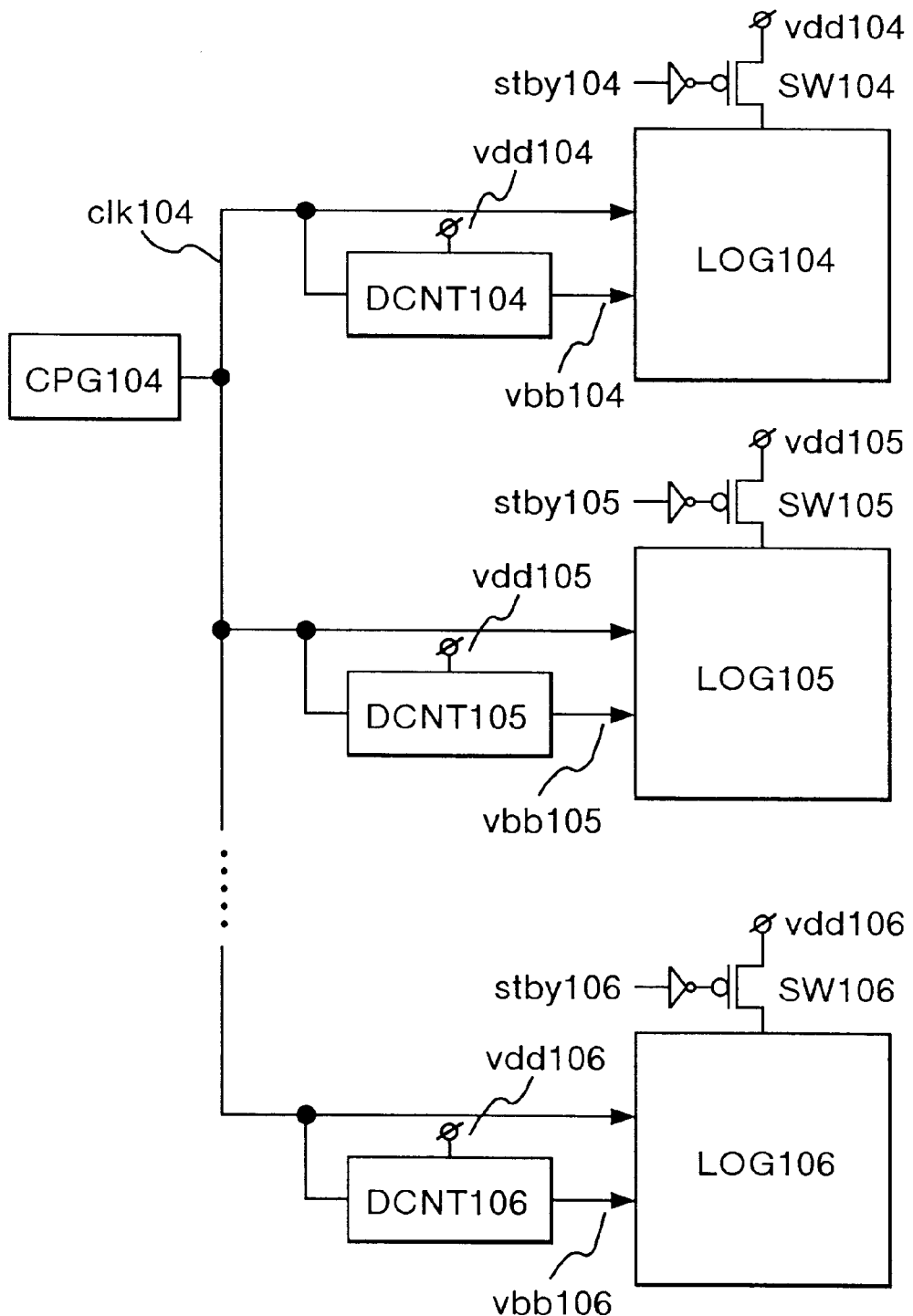
FIG. 63 is a diagram showing the configuration of another embodiment of the invention.

FIG. 63 shows a developed example of FIG. 62. As illustrated in FIG. 63, by providing switch MOSS SW104, SW105, and SW106 to main circuits, and turning them off at the time of standby or the like, the power of each block can be further reduced. When it is designed so that the leakage current of an FET as a switch is smaller than the sum of the leakage the currents of FETs in a block, the effect of reduction in the leakage current in the standby mode or the like can be obtained. For example, the switch can be constructed by an MOSFET having a high threshold.

Figure 64:
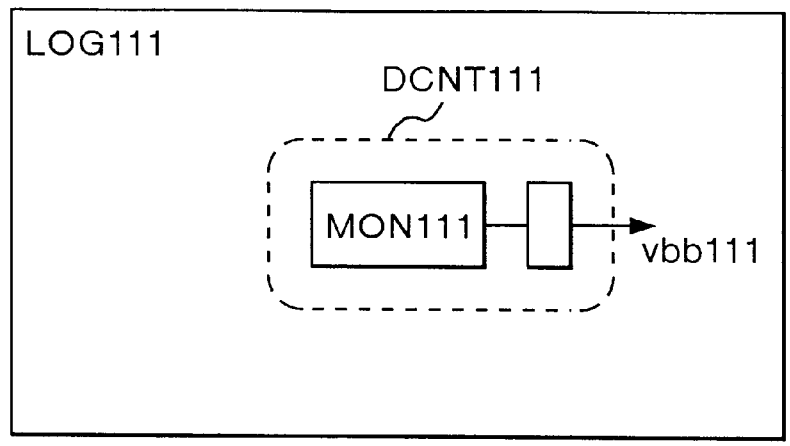
FIG. 64 is a diagram showing the configuration of another embodiment of the invention.

FIG. 64 is a diagram showing another embodiment of the invention. In a main circuit LOG 11 representing one of a plurality of blocks provided for related processes, by laying out a speed controller DCNT111, especially, a delay detector MON111 to be in the center of the block, the delay detector MON111 can be designed so as to represent the operating characteristics of the block.

Figure 66:
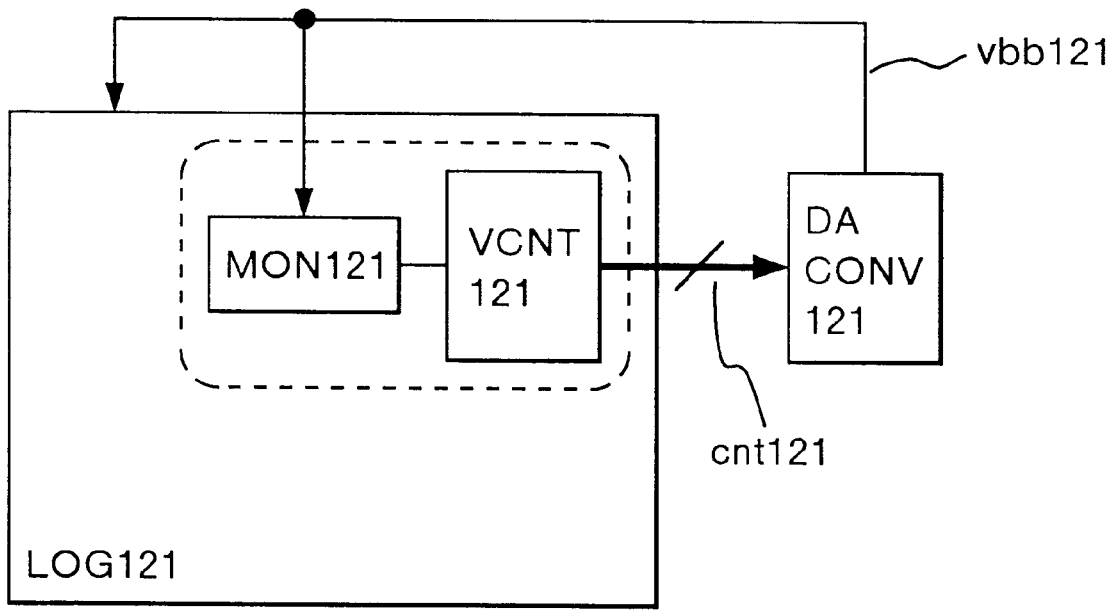
FIG. 66 is a diagram showing the configuration of another embodiment of the invention.

FIG. 66 is a diagram showing another embodiment of the invention. In a main circuit LOG121, a delay detector MON121 and a voltage-controlled circuit VCNT121 in a speed controller are formed. A digital-to-analog converter DACONV121 for generating a control voltage can be fabricated on a different chip. Consequently, the number of circuits in the speed controller, which have to be formed in the main circuit, is decreased, thereby enabling the area and-the power consumption to be reduced.

INDUSTRIAL APPLICABILITY

As described above, according to the invention, by controlling the threshold of an MOS transistor constructing a circuit, the characteristics fluctuation of a CMOS circuit is suppressed so that the operating speed can be improved. By preliminarily setting the threshold of the MOS transistor to a low value in a process, the improvement in speed becomes more effective. In order to digitally detect the characteristics fluctuation amount, the control circuit takes the form of a digital circuit so that the time of stabilizing the control signal can be shortened. Since the control circuit can be formed in a small circuit scale, a plurality of control circuits can be arranged within a semiconductor integrated circuit whose threshold has to be controlled, and a local characteristics fluctuation can be suppressed. Further, the local power control in the semiconductor integrated circuit can be realized.

What is claimed is:

1. A semiconductor integrated circuit device comprising: a logic circuit for performing a predetermined process; a digital-to-analog converter for generating a substrate bias for controlling a threshold of an MIS transistor constructing the logic circuit; a voltage-controlled circuit for outputting a control signal in accordance with a delay signal; and a delay detector receives a clock signal supplied from the outside and outputs the delay signal, the voltage-controlled circuit receives the delay signal of the delay detector and outputs the control signal according to a delay time indicated by the delay signal, the digital-to-analog converter receives the control signal supplied from the voltage-controlled circuit and generates a voltage according to the control signal, and the operating speed of the logic circuit and the delay detector is controlled by a voltage supplied from the digital-to-analog converter.

2. The semiconductor integrated circuit device according to claim 1, characterized in that the delay detector comprises a clock-duty modulator and a delay monitoring circuit, the voltage-controlled circuit is constructed by a delay comparator, the digital-to-analog converter is constructed by a substrate-bias generator, the clock-duty modulator receives the clock signal from the outside and outputs a clock signal of an arbitrary clock duty ratio, the delay monitoring circuit outputs an output signal of the clock-duty modulator with a predetermined delay, the delay comparator obtains a delay difference between the output signal of the clock-duty modulator and the output signal of the delay monitoring circuit by comparison and outputs the control signal according to the difference, the substrate-bias generator generates a substrate bias according to the control signal of the delay comparator, and the delay in each of the logic circuit and the delay monitoring circuit is controlled by the substrate bias generated by the substrate-bias generator.

3. A semiconductor integrated circuit device comprising:

a logic circuit which performs a predetermined process;

a delay monitoring circuit which receives a first clock signal and outputs a delay signal;

a digital-to-analog converter which generates a substrate bias for controlling a threshold of a first MIS transistor constructing said logic circuit and a threshold of a second MIS transistor constructing said delay monitoring circuit; and a voltage control circuit which outputs a control signal;

wherein said voltage control circuit receives the delay signal and the first clock signal and outputs the control signal according to a comparison between the first clock signal and the delay signal, said digital-to-analog converter receives the control signal supplied from said voltage control circuit and generates a voltage according to the control signal.

4. The semiconductor integrated circuit device according to claim 3, further comprising a clock-duty modulator which receives a reference clock signal and outputs the first clock signal.

5. The semiconductor integrated circuit device according to claim 3, wherein said delay monitoring circuit comprises inverters connected in series.

6. The semiconductor integrated circuit device according to claim 3, wherein the voltage control circuit includes a delay comparator which compares a delay of the delay signal and a delay of the first clock signal.

* * * * *